(12) United States Patent
Filson et al.

(10) Patent No.: US 9,121,623 B2
(45) Date of Patent: Sep. 1, 2015

(54) THERMOSTAT WITH WIRING TERMINALS CONFIGURED FOR SPATIAL COMPACTNESS AND EASE OF WIRE INSTALLATION

(71) Applicant: Google Inc., Mountain View, CA (US)

(72) Inventors: John Benjamin Filson, Mountain View, CA (US); Eric B. Daniels, East Palo Alto, CA (US); Brian Huppi, San Francisco, CA (US); David Sloo, Menlo Park, CA (US)

(73) Assignee: Google Inc., Mountain View, CA (US)

( * ) Notice: Subject to any disclaimer, the term of this patent is extended or adjusted under 35 U.S.C. 154(b) by 0 days.

(21) Appl. No.: 13/624,878

(22) Filed: Sep. 21, 2012

(65) Prior Publication Data

US 2013/0099010 A1     Apr. 25, 2013

Related U.S. Application Data

(60) Provisional application No. 61/627,996, filed on Oct. 21, 2011.

(51) Int. Cl.
*G05D 23/00* (2006.01)
*F24F 11/00* (2006.01)
(Continued)

(52) U.S. Cl.
CPC ............. *F24F 11/0034* (2013.01); *F24F 11/00* (2013.01); *F24F 11/001* (2013.01);
(Continued)

(58) Field of Classification Search
CPC ............. F24F 11/0034; F24F 11/0009; F24F 11/0086; F24F 11/02; F24F 11/0091; G01K 11/02; G06F 3/0487; G05D 23/1919; G05D 23/19; G05D 22/00; G05D 23/01; G05D 23/185; G05D 23/1917; G05D 23/1925; G05D 23/0487
USPC ............. 236/51, 49.3, 94, 1 C; 700/276, 278; 200/293, 303, 5 A
See application file for complete search history.

(56) References Cited

U.S. PATENT DOCUMENTS 4,948,040 A     8/1990 Kobayashi et al.
5,065,813 A     11/1991 Berkeley et al.
(Continued)

FOREIGN PATENT DOCUMENTS

EP     447458 A1     9/1991
EP     510807 A2     10/1992
(Continued)

OTHER PUBLICATIONS

Aprilaire Electronic Thermostats Model 8355 User's Manual, Research Products Corporation, 2000, 16 pages.
(Continued)

*Primary Examiner* — Frantz Jules
*Assistant Examiner* — Azim Abdur Rahim
(74) *Attorney, Agent, or Firm* — Kilpatrick Townsend & Stockton LLP

(57) ABSTRACT

A wall-mountable programmable electronic thermostat for controlling an HVAC system is described. The thermostat includes a circular wall-mountable backplate with a central opening to allow for the passage of HVAC wires for electrical connection to the thermostat. The head unit body is also circular and is removeably mountable to the back plate. A plurality of wedge-shaped wiring terminals are mounted on the backplate for making a tool-free connection to HVAC wires. Each wiring terminal has button that a user can depress while a wire is inserted in a wire hole. The terminals are arranged along one or more circular arcs about the central opening of the backplate such that the wire holes face the central opening and the buttons are located close to the outer periphery of the backplate.

22 Claims, 21 Drawing Sheets

(51) Int. Cl.

| | |
|---|---|
| *G05D 23/19* | (2006.01) |
| *G05D 23/27* | (2006.01) |
| *G06F 3/0487* | (2013.01) |
| *G05D 23/24* | (2006.01) |
| *G01J 5/00* | (2006.01) |
| *G01J 5/04* | (2006.01) |
| *G06N 99/00* | (2010.01) |
| *H04L 29/08* | (2006.01) |
| *G01K 1/02* | (2006.01) |

(52) U.S. Cl.
CPC .......... *F24F11/006* (2013.01); *F24F 11/0009* (2013.01); *F24F 11/0012* (2013.01); *F24F 11/0076* (2013.01); *F24F 11/0086* (2013.01); *G01J 5/0025* (2013.01); *G01J 5/041* (2013.01); *G01K 1/02* (2013.01); *G05D 23/19* (2013.01); *G05D 23/1902* (2013.01); *G05D 23/1919* (2013.01); *G05D 23/1932* (2013.01); *G05D 23/2434* (2013.01); *G05D 23/2723* (2013.01); *G06F 3/0487* (2013.01); *G06N 99/005* (2013.01); *H04L 67/10* (2013.01); *F24F 2011/0035* (2013.01); *F24F 2011/0036* (2013.01); *F24F 2011/0071* (2013.01); *F24F 2011/0091* (2013.01); *Y02B 60/50* (2013.01); *Y02T 10/88* (2013.01)

(56) References Cited

U.S. PATENT DOCUMENTS

| | | | |
|---|---|---|---|
| 5,161,606 A | 11/1992 | Berkeley et al. | |
| 5,452,762 A | 9/1995 | Zillner, Jr. | |
| 5,467,921 A | 11/1995 | Shreeve et al. | |
| 5,950,709 A | 9/1999 | Krueger et al. | |
| 6,102,749 A | 8/2000 | Lynn et al. | |
| 6,623,311 B1* | 9/2003 | Dehan | 439/721 |
| 6,851,621 B1 | 2/2005 | Wacker et al. | |
| 6,851,967 B2 | 2/2005 | Miyoshi et al. | |
| 6,997,390 B2 | 2/2006 | Alles | |
| 7,055,759 B2 | 6/2006 | Wacker et al. | |
| 7,083,109 B2 | 8/2006 | Pouchak | |
| 7,156,318 B1 | 1/2007 | Rosen | |
| 7,159,789 B2 | 1/2007 | Schwendinger et al. | |
| 7,167,079 B2 | 1/2007 | Smyth et al. | |
| 7,181,317 B2 | 2/2007 | Amundson et al. | |
| 7,360,370 B2 | 4/2008 | Shah et al. | |
| 7,562,536 B2 | 7/2009 | Harrod et al. | |
| 7,575,179 B2 | 8/2009 | Morrow et al. | |
| 7,584,899 B2 | 9/2009 | de Pauw et al. | |
| 7,634,504 B2 | 12/2009 | Amundson | |
| 7,726,581 B2 | 6/2010 | Naujok et al. | |
| 7,748,640 B2 | 7/2010 | Roher et al. | |
| 7,844,764 B2 | 11/2010 | Williams | |
| 7,847,681 B2 | 12/2010 | Singhal et al. | |
| 8,067,912 B2 | 11/2011 | Mullin | |
| 8,195,313 B1 | 6/2012 | Fadell et al. | |
| 2004/0130454 A1 | 7/2004 | Barton | |
| 2004/0193324 A1 | 9/2004 | Hoog et al. | |
| 2004/0238651 A1 | 12/2004 | Juntunen et al. | |
| 2005/0040250 A1 | 2/2005 | Wruck | |
| 2005/0159846 A1 | 7/2005 | Van Ostrand et al. | |
| 2005/0279841 A1* | 12/2005 | Schwendinger et al. | 236/1 C |
| 2007/0045441 A1 | 3/2007 | Ashworth et al. | |
| 2007/0157639 A1 | 7/2007 | Harrod | |
| 2007/0208461 A1 | 9/2007 | Chase | |
| 2007/0221741 A1* | 9/2007 | Wagner et al. | 236/94 |
| 2007/0228183 A1 | 10/2007 | Kennedy et al. | |
| 2008/0128523 A1 | 6/2008 | Hoglund et al. | |
| 2008/0161977 A1 | 7/2008 | Takach et al. | |
| 2009/0057425 A1 | 3/2009 | Sullivan et al. | |
| 2009/0140056 A1 | 6/2009 | Leen | |
| 2009/0140064 A1 | 6/2009 | Schultz et al. | |
| 2009/0140065 A1 | 6/2009 | Juntunen et al. | |
| 2009/0143879 A1 | 6/2009 | Amundson et al. | |
| 2009/0143880 A1 | 6/2009 | Amundson et al. | |
| 2010/0084482 A1 | 4/2010 | Kennedy et al. | |
| 2010/0114382 A1 | 5/2010 | Ha et al. | |
| 2010/0131112 A1 | 5/2010 | Amundson et al. | |
| 2010/0163635 A1 | 7/2010 | Ye | |
| 2010/0198425 A1 | 8/2010 | Donovan | |
| 2010/0298985 A1 | 11/2010 | Hess et al. | |

FOREIGN PATENT DOCUMENTS

| | | |
|---|---|---|
| SI | 20556 A | 10/2001 |
| WO | 2005019740 A1 | 3/2005 |
| WO | 2007027554 A2 | 3/2007 |
| WO | 2013/058932 | 4/2013 |

OTHER PUBLICATIONS

Braeburn 5300 Installer Guide, Braeburn Systems, LLC, 2009, 10 pages.
Braeburn Model 5200, Braeburn Systems, LLC, 2011, 11 pages.
Ecobee Smart Thermostat Installation Manual, 2011, 20 pages.
Ecobee Smart Thermostat User Manual, 2010, 20 pages.
Honeywell Installation Guide FocusPRO TH6000 Series, Honeywell International, Inc., 2012, 24 pages.
Honeywell Operating Manual FocusPRO TH6000 Series, Honeywell International, Inc., 2011, 80 pages.
Honeywell Prestige IAQ Product Data, Honeywell International, Inc., 2012, 126 pages.
Honeywell Prestige THX9321-9421 Operating Manual, Honeywell International, Inc., 2011, 120 pages.
Hunter Internet Thermostat Installation Guide, Hunter Fan Co., 2012, 8 pages.
Lennox ComfortSense 5000 Owners Guide, Lennox Industries, Inc., 2007, 32 pages.
Lennox ComfortSense 7000 Owners Guide, Lennox Industries, Inc., 2009, 15 pages.
Lennox iComfort Manual, Lennox Industries, Inc., 2010, 20 pages.
Lux PSPU732T Manual, LUX Products Corporation, No Date Given, 48 pages.
RobertShaw Product Manual 9620, Maple Chase Company, 2001, 14 pages.
RobertShaw Product Manual 9825i2, Maple Chase Company, 2006, 36 pages.
SYSTXCCUIZ01-V Infinity Control Installation Instructions, Carrier Corp, 2012, 20 pages.
TB-PAC, TB-PHP, Base Series Programmable Thermostats, Carrier Corp, 2012, 8 pages.
Trane Communicating Thermostats for Fan Coil, Trane, 2011, 32 pages.
Trane Communicating Thermostats for Heat Pump Control, Trane, 2011, 32 pages.
Trane Install XL600-Installation-Manual, Trane, 2006, 16 pages.
Trane XL950 Installation Guide, Trane, 2011, 20 pages.
Venstar T2900Manual, Venstar, Inc., 2008, 113 pages.
Venstar T5800Manual, Venstar, Inc., No Date Given, 63 pages.
VisionPRO TH8000 Series Installation Guide, Honeywell International, Inc., 2012, 12 pages.
VisionPRO TH8000 Series Operating Manual, Honeywell International, Inc., 2012, 96 pages.
VisionPRO Wi-Fi Programmable Thermostat, Honeywell International, Inc, 2012, 48 pages.
White Rodgers (Emerson) Model 1F81-261 Installation and Operating Instructions, White Rodgers, No Date Given, 63 pages.
White Rodgers (Emerson) Model IF98EZ-1621 Homeowner's User Guide, White Rodgers, No Date Given, 28 pages.
Installation and Start-Up Instructions Evolution Control SYSTXB-BUID01, Bryant Heating & Cooling Systems, 2004, 12 pages.
International Search Report & Written Opinion issued in Application No. PCT/US2012/56765 mailed on Dec. 24, 2012, 12 pages.
International Preliminary Report on Patentability mailed Apr. 22, 2014 for International Patent Application No. PCT/US2012/056765 filed Sep. 22, 2012, 12 pages.

* cited by examiner

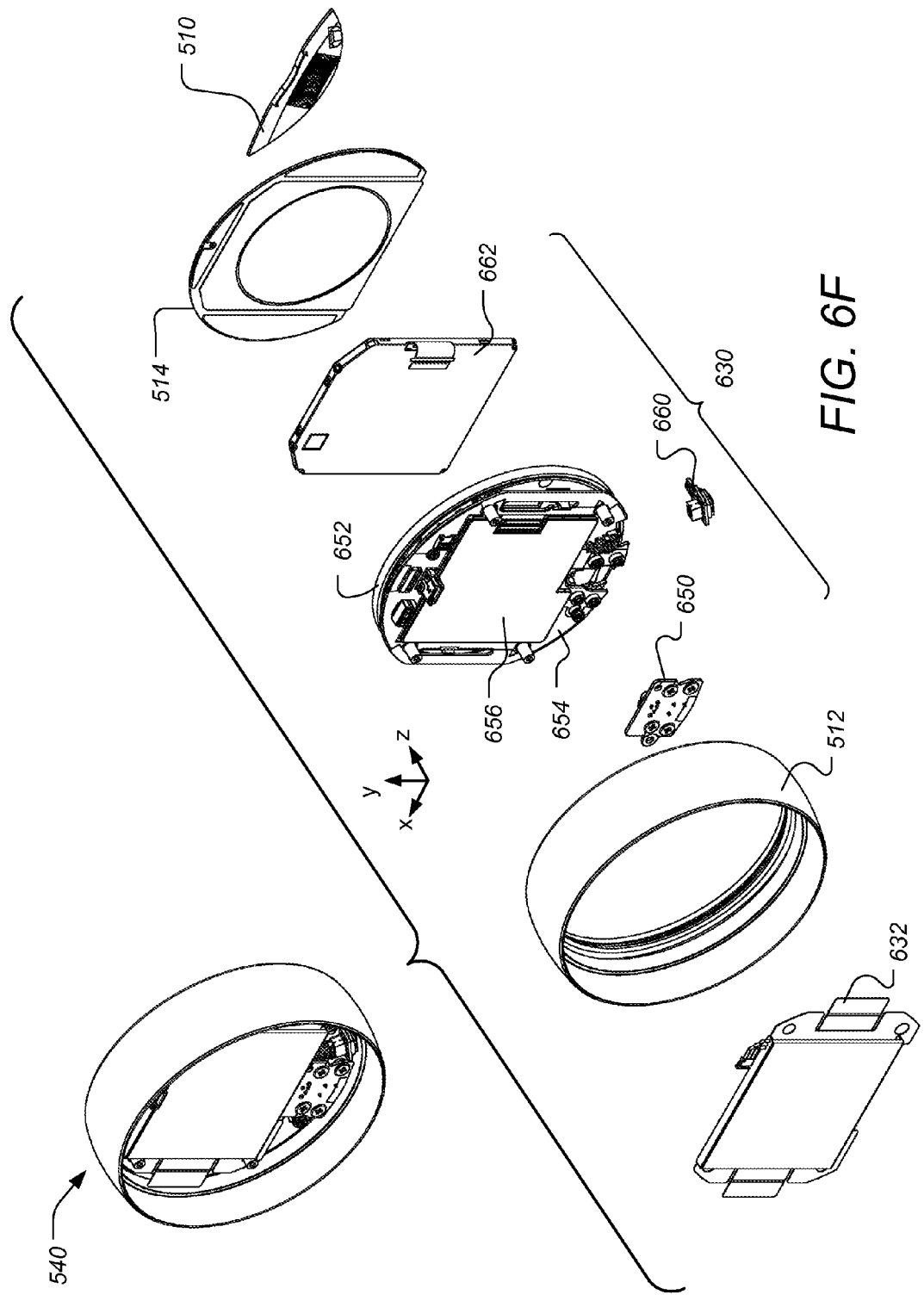

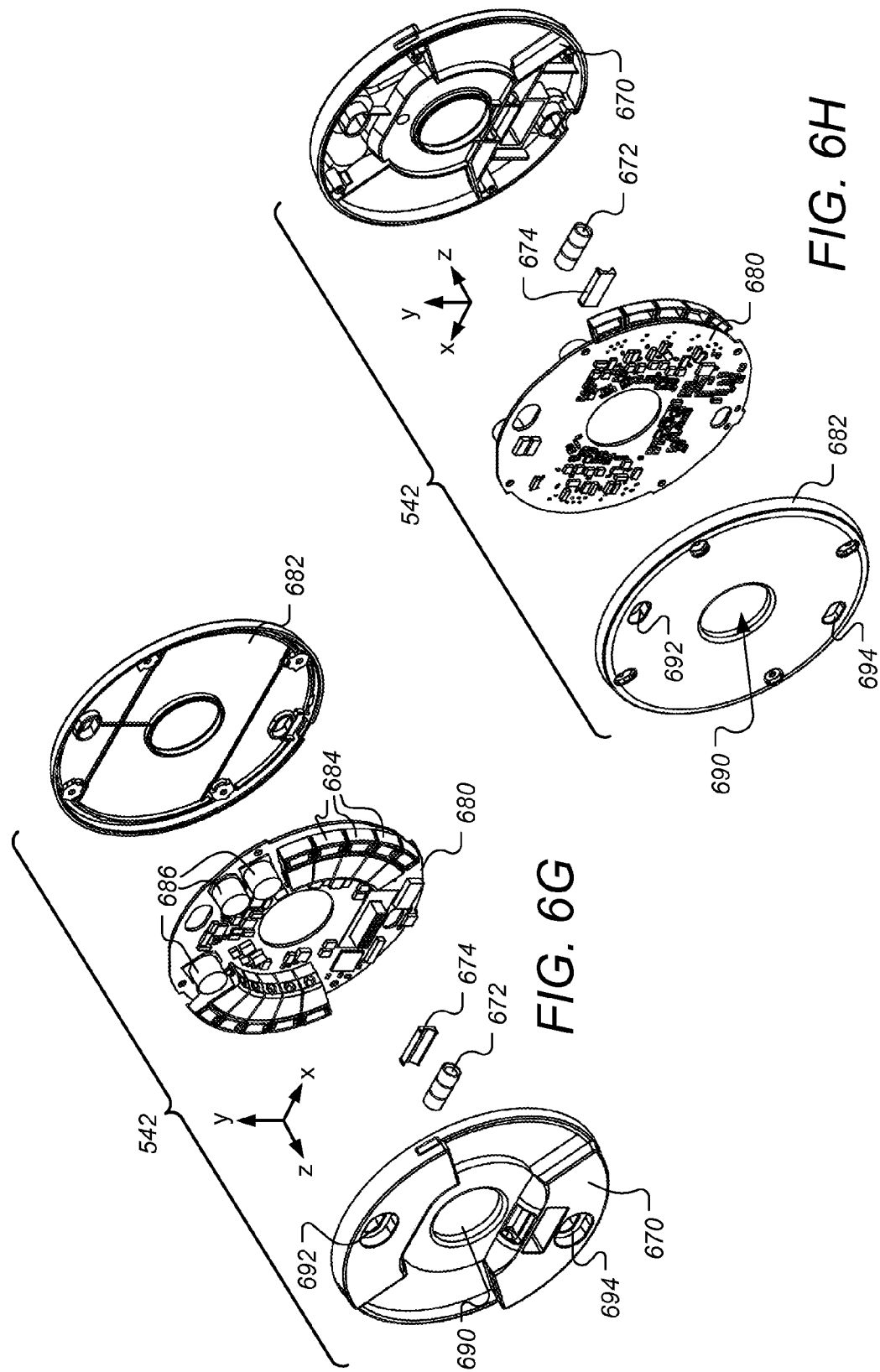

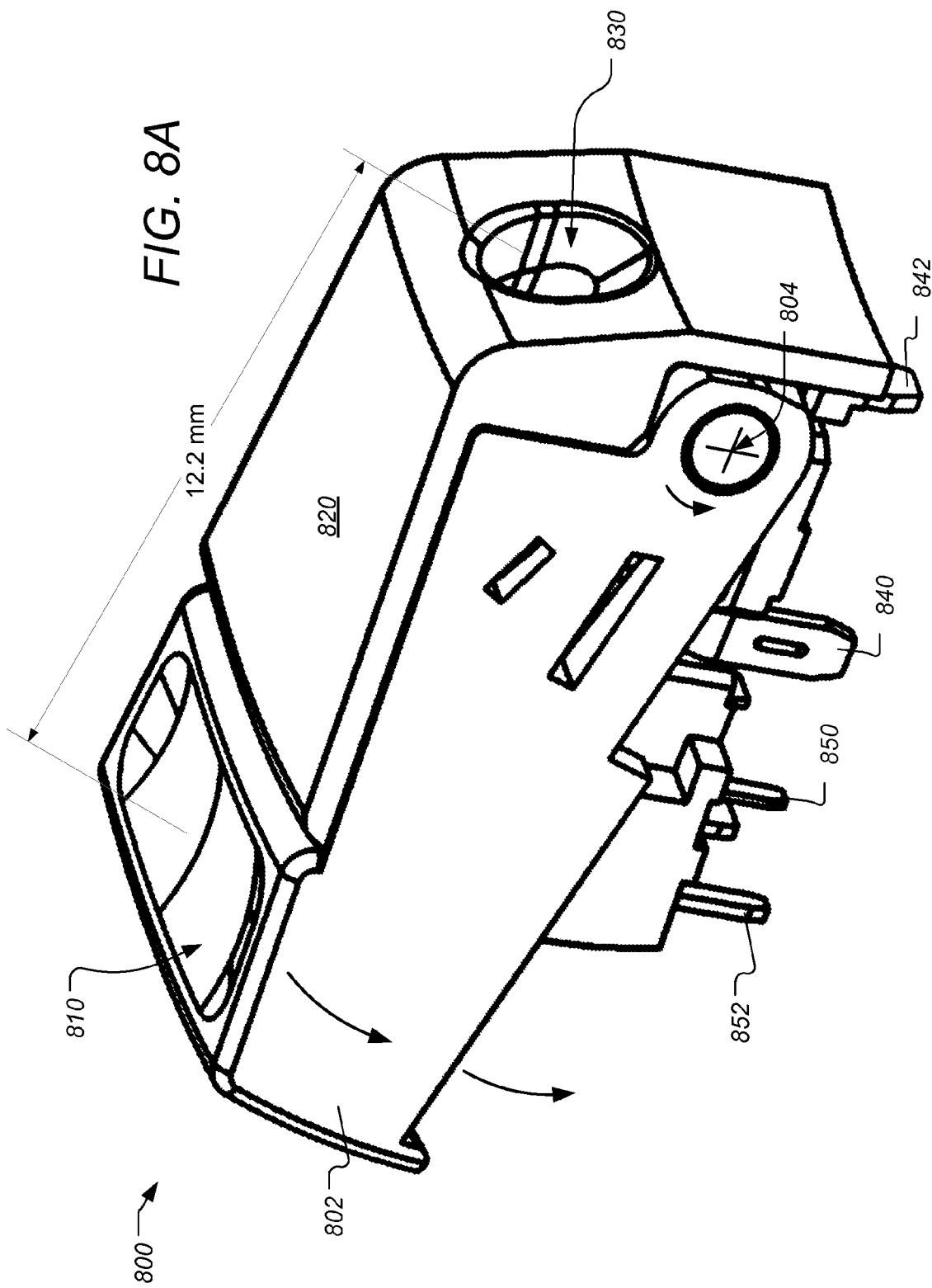

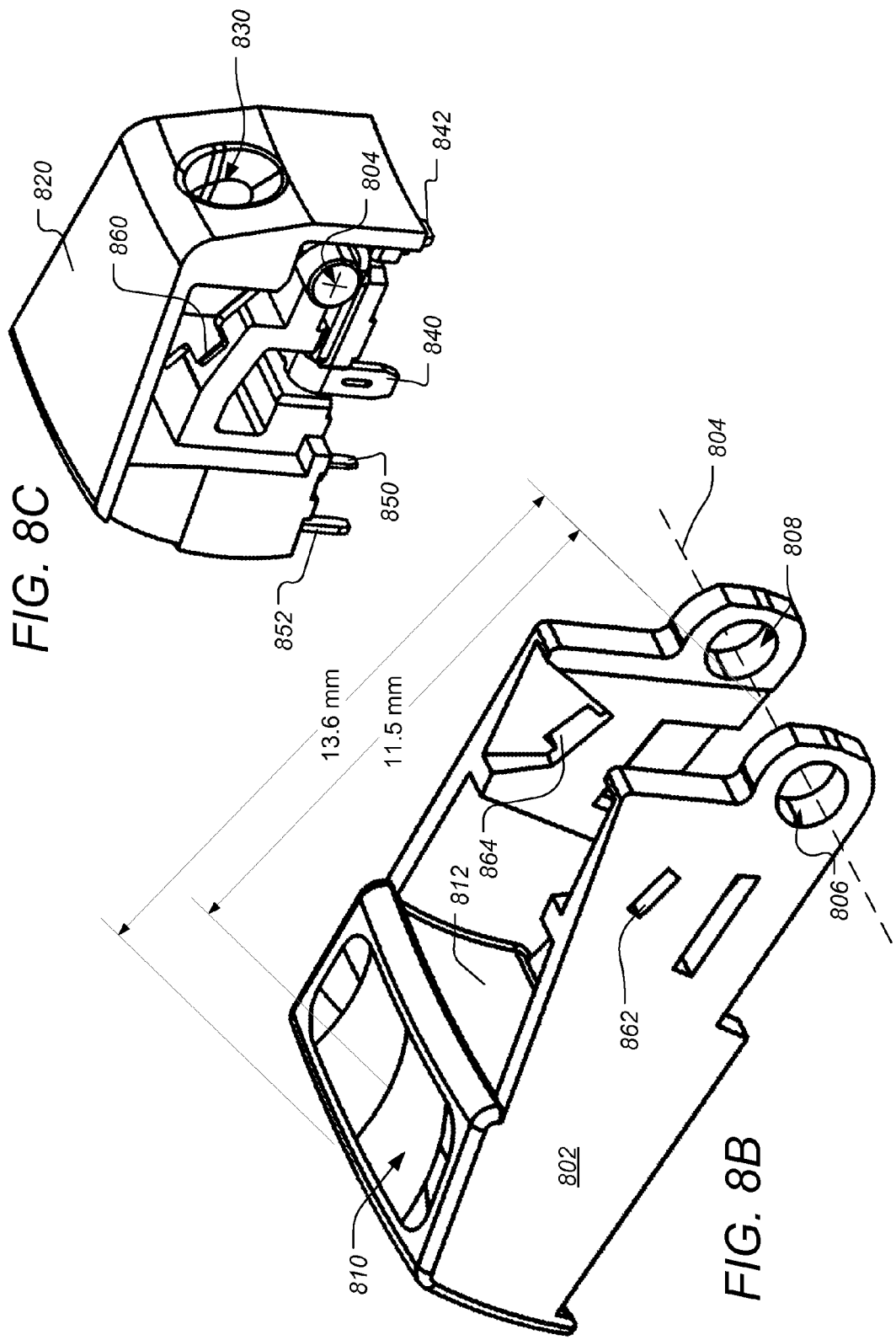

THERMOSTAT WITH WIRING TERMINALS CONFIGURED FOR SPATIAL COMPACTNESS AND EASE OF WIRE INSTALLATION

This application claims the benefit of the commonly assigned U.S. Prov. Ser. No. 61/627,996 filed Oct. 21, 2011, which is incorporated by reference herein.

FIELD

This patent specification relates to systems, methods, and related computer program products for the monitoring and control of energy-consuming systems or other resource-consuming systems. More particularly, this patent specification relates a thermostat with wiring terminals configured for spatial compactness and ease of wire installation.

BACKGROUND

In designing a wall-mounted thermostat that is relatively sleek and small it is nevertheless desirable to allow for terminals that have ease of access and ease of installation. In particular it is desirable to allow for ease of wall mounting and for ease of connection of the control wires to the terminals. Thermostat wires are often solid wires of relatively heavy gauge. As a result the wires protruding from a small hole in the wall are rather stiff and may be difficult to bend and otherwise manipulate and to attach properly to thermostat connection terminals. Also it is desirable to have a tool free method of wire connection (i.e. without the use screws and/or the use of screw driver).

It is to be appreciated that although exemplary embodiments are presented herein for the particular context of HVAC system control, there are a wide variety of other resource usage contexts for which the embodiments are readily applicable including, but not limited to, water usage, air usage, the usage of other natural resources, and the usage of other (i.e., non-HVAC-related) forms of energy, as would be apparent to the skilled artisan in view of the present disclosure. Therefore, such application of the embodiments in such other resource usage contexts is not outside the scope of the present teachings.

SUMMARY

According to one or more embodiments, a wall-mountable programmable electronic thermostat for controlling an HVAC system is described. The thermostat includes: a generally rounded backplate adapted to be mounted on a wall having a central opening to allow for the passage of a plurality of HVAC wires for electrical connection to the thermostat; a generally rounded head unit body including a display for displaying information to a user, the head unit removeably mountable to the back plate; and a plurality of wiring terminals each adapted and configured to make an electrical connection with an HVAC wire; wherein the plurality of wiring terminals are mounted on the backplate and arranged along one or more arcs about the central opening of the backplate.

According to some embodiments, the backplate is circular-shaped and the plurality of wiring terminals are arranged along one or more circular arcs about the central opening of the backplate. The wiring terminals are arranged along two circular arcs each including at least four or five wiring terminals. Each of the wiring terminals is generally wedge-shaped having a wire hole facing the central opening and the button member being positioned near an outer periphery of the backplate. According to some embodiments, each of generally wedge-shaped terminals occupies between 10 and 20 degrees, and more preferably between 14 and 16 degrees of angular space as measured by an angle having a vertex at a center of the backplate.

Each of the wiring terminals includes a wire hole configured to accept insertion of an HVAC wire, wherein a distance from a center of the central opening to each wire hole is at least 15 mm. Each wiring terminal is preferably configured to allow a user to make an electrical connection with an HVAC wire without the use of tools by pressing a button member on the wiring terminal and inserting the HVAC wire into a wire hole. The wiring terminals can be arranged such that the button members are positioned close to an outer periphery of the backplate and the wire holes are closer to the central opening than the button members.

According to some embodiments, each of the wiring terminals is configured such that the physical presence of a wire inserted into the wiring terminal can be mechanically detected by switching of a loop of an electrical circuit that does not include the inserted HVAC wire.

According to some embodiments, a wall-mountable programmable electronic thermostat for controlling an HVAC system is described that includes: a backplate adapted to be mounted on a wall having a central opening to allow for the passage of a plurality of HVAC wires for electrical connection to the thermostat; a head unit body including a display for displaying information to a user, the head unit removeably mountable to the back plate; and a plurality of tool-free wiring terminals each adapted and configured to make an electrical connection with an HVAC wire, each of the wiring terminals are adapted and configured to allow a user to make an electrical connection with an HVAC wire without the use of tools by pressing a button member and inserting an HVAC wire into a wire hole, wherein a distance between the button member and the wire hole is at least 8 millimeters. According to some embodiments, the distance between the button member and the wire hole is at least 10 millimeters, and the button member when pressed actuates a lever that is at least 10 millimeters in length.

It will be appreciated that these systems and methods are novel, as are applications thereof and many of the components, systems, methods and algorithms employed and included therein. It should be appreciated that embodiments of the presently described inventive body of work can be implemented in numerous ways, including as processes, apparata, systems, devices, methods, computer readable media, computational algorithms, embedded or distributed software and/or as a combination thereof. Several illustrative embodiments are described below.

BRIEF DESCRIPTION OF THE DRAWINGS

The inventive body of work will be readily understood by referring to the following detailed description in conjunction with the accompanying drawings, in which:

FIGS. 6E-6F illustrate exploded front and rear perspective views, respectively, of a head unit frontal assembly with respect to its primary components, according to some embodiments;

FIGS. 6G-6H illustrate exploded front and rear perspective views, respectively, of a backplate unit with respect to its primary components, according to some embodiments;

FIGS. 8A-8E are perspective views showing further details of a tool-free thermostat wiring connector, according to some embodiments;

DETAILED DESCRIPTION

Figure 1:
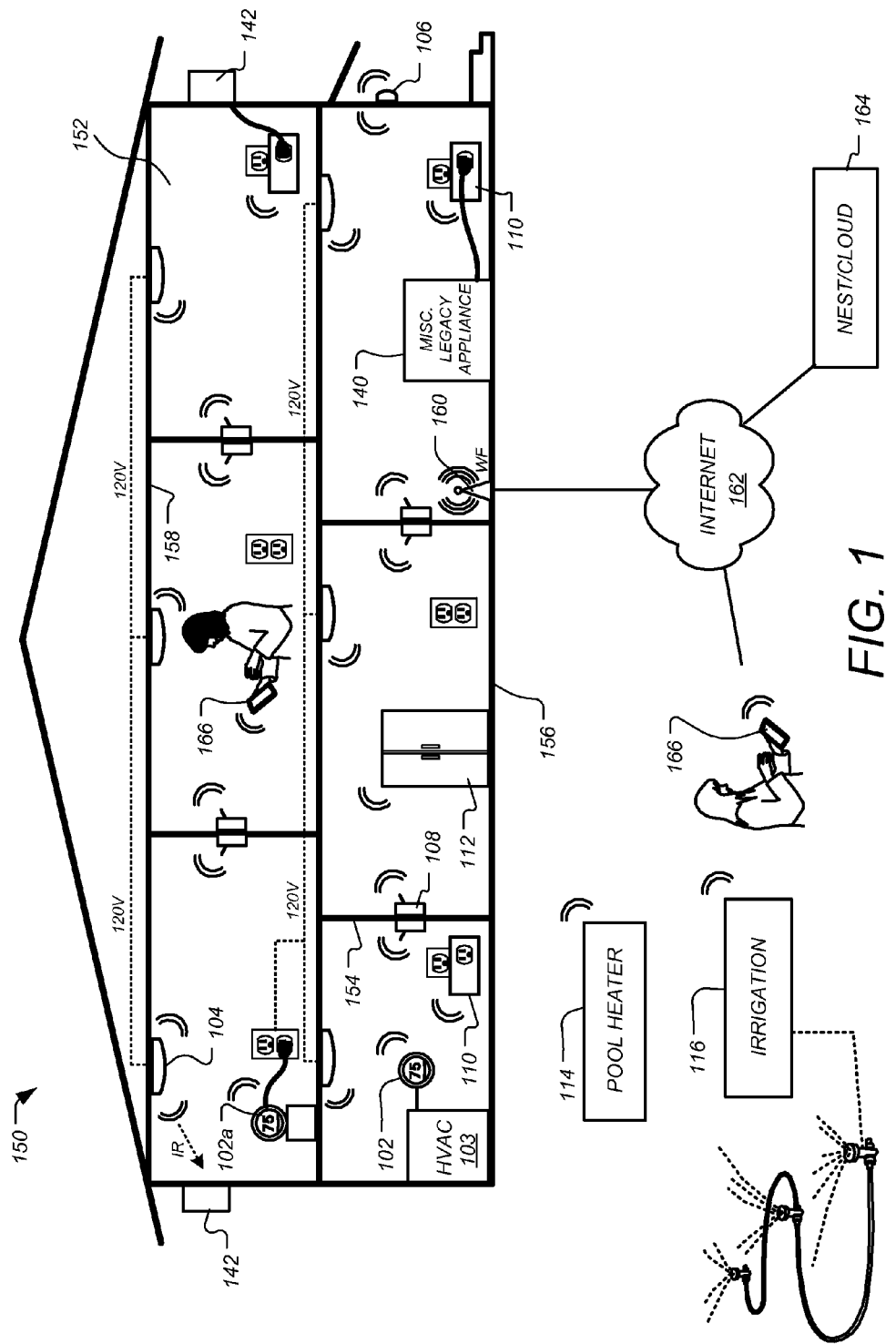
FIG. 1 illustrates an example of a smart home environment within which one or more of the devices, methods, systems, services, and/or computer program products described further herein can be applicable.

The subject matter of this patent specification relates to the subject matter of the following commonly assigned applications, each of which is incorporated by reference herein: U.S. Ser. No. 13/033,573 filed Feb. 23, 2011; U.S. Ser. No. 13/034,666 filed Feb. 24, 2011; and International Application Ser. No. PCT/US12/00007 filed Jan. 3, 2012. The subject matter of this patent specification further relates to the subject matter of the commonly assigned U.S. Ser. No. 13/624,811, entitled "Thermostat With Ring-Shaped Control Member" filed even date herewith, which is incorporated by reference herein. The subject matter of this patent specification further relates to the subject matter of the commonly assigned U.S. Ser. No. 13/624,881, entitled "Integrating Sensing Systems Into Thermostat Housing In Manners Facilitating Compact And Visually Pleasing Physical Characteristics Thereof" filed even date herewith, which is incorporated by reference herein. The above-referenced patent applications are collectively referenced herein as "the commonly assigned incorporated applications."

A detailed description of the inventive body of work is provided herein. While several embodiments are described, it should be understood that the inventive body of work is not limited to any one embodiment, but instead encompasses numerous alternatives, modifications, and equivalents. In addition, while numerous specific details are set forth in the following description in order to provide a thorough understanding of the inventive body of work, some embodiments can be practiced without some or all of these details. Moreover, for the purpose of clarity, certain technical material that is known in the related art has not been described in detail in order to avoid unnecessarily obscuring the inventive body of work.

As used herein the term "HVAC" includes systems providing both heating and cooling, heating only, cooling only, as well as systems that provide other occupant comfort and/or conditioning functionality such as humidification, dehumidification and ventilation.

As used herein the terms power "harvesting," "sharing" and "stealing" when referring to HVAC thermostats all refer to thermostats that are designed to derive power from the power transformer through the equipment load without using a direct or common wire source directly from the transformer.

As used herein the term "residential" when referring to an HVAC system means a type of HVAC system that is suitable to heat, cool and/or otherwise condition the interior of a building that is primarily used as a single family dwelling. An example of a cooling system that would be considered residential would have a cooling capacity of less than about 5 tons of refrigeration (1 ton of refrigeration=12,000 Btu/h).

As used herein the term "light commercial" when referring to an HVAC system means a type of HVAC system that is suitable to heat, cool and/or otherwise condition the interior of a building that is primarily used for commercial purposes, but is of a size and construction that a residential HVAC system is considered suitable. An example of a cooling system that would be considered residential would have a cooling capacity of less than about 5 tons of refrigeration.

As used herein the term "thermostat" means a device or system for regulating parameters such as temperature and/or humidity within at least a part of an enclosure. The term "thermostat" may include a control unit for a heating and/or cooling system or a component part of a heater or air conditioner. As used herein the term "thermostat" can also refer generally to a versatile sensing and control unit (VSCU unit) that is configured and adapted to provide sophisticated, customized, energy-saving HVAC control functionality while at the same time being visually appealing, non-intimidating, elegant to behold, and delightfully easy to use.

FIG. 1 illustrates an example of a smart home environment within which one or more of the devices, methods, systems, services, and/or computer program products described further herein can be applicable. The depicted smart home environment includes a structure 150, which can include, e.g., a house, office building, garage, or mobile home. It will be appreciated that devices can also be integrated into a smart home environment that does not include an entire structure 150, such as an apartment, condominium, or office space. Further, the smart home environment can control and/or be coupled to devices outside of the actual structure 150. Indeed, several devices in the smart home environment need not physically be within the structure 150 at all. For example, a device controlling a pool heater or irrigation system can be located outside of the structure 150.

The depicted structure 150 includes a plurality of rooms 152, separated at least partly from each other via walls 154. The walls 154 can include interior walls or exterior walls. Each room can further include a floor 156 and a ceiling 158. Devices can be mounted on, integrated with and/or supported by a wall 154, floor or ceiling.

The smart home depicted in FIG. 1 includes a plurality of devices, including intelligent, multi-sensing, network-connected devices that can integrate seamlessly with each other and/or with cloud-based server systems to provide any of a variety of useful smart home objectives. One, more or each of the devices illustrated in the smart home environment and/or in the figure can include one or more sensors, a user interface, a power supply, a communications component, a modularity unit and intelligent software as described herein. Examples of devices are shown in FIG. 1.

An intelligent, multi-sensing, network-connected thermostat 102 can detect ambient climate characteristics (e.g., temperature and/or humidity) and control a heating, ventilation and air-conditioning (HVAC) system 103. One or more intelligent, network-connected, multi-sensing hazard detection units 104 can detect the presence of a hazardous substance and/or a hazardous condition in the home environment (e.g., smoke, fire, or carbon monoxide). One or more intelligent, multi-sensing, network-connected entryway interface devices 106, which can be termed a "smart doorbell", can detect a person's approach to or departure from a location, control audible functionality, announce a person's approach or departure via audio or visual means, or control settings on a security system (e.g., to activate or deactivate the security system).

Each of a plurality of intelligent, multi-sensing, network-connected wall light switches 108 can detect ambient lighting conditions, detect room-occupancy states and control a power and/or dim state of one or more lights. In some instances, light switches 108 can further or alternatively control a power state or speed of a fan, such as a ceiling fan. Each of a plurality of intelligent, multi-sensing, network-connected wall plug interfaces 110 can detect occupancy of a room or enclosure and control supply of power to one or more wall plugs (e.g., such that power is not supplied to the plug if nobody is at home). The smart home may further include a plurality of intelligent, multi-sensing, network-connected appliances 112, such as refrigerators, stoves and/or ovens, televisions, washers, dryers, lights (inside and/or outside the structure 150), stereos, intercom systems, garage-door openers, floor fans, ceiling fans, whole-house fans, wall air conditioners, pool heaters 114, irrigation systems 116, security systems (including security system components such as cameras, motion detectors and window/door sensors), and so forth. While descriptions of FIG. 1 can identify specific sensors and functionalities associated with specific devices, it will be appreciated that any of a variety of sensors and functionalities (such as those described throughout the specification) can be integrated into the device.

In addition to containing processing and sensing capabilities, each of the devices 102, 104, 106, 108, 110, 112, 114 and 116 can be capable of data communications and information sharing with any other of the devices 102, 104, 106, 108, 110, 112, 114 and 116, as well as to any cloud server or any other device that is network-connected anywhere in the world. The devices can send and receive communications via any of a variety of custom or standard wireless protocols (Wi-Fi, ZigBee, 6LoWPAN, etc.) and/or any of a variety of custom or standard wired protocols (CAT6 Ethernet, HomePlug, etc.). The wall plug interfaces 110 can serve as wireless or wired repeaters, and/or can function as bridges between (i) devices plugged into AC outlets and communicating using Homeplug or other power line protocol, and (ii) devices that not plugged into AC outlets.

For example, a first device can communicate with a second device via a wireless router 160. A device can further communicate with remote devices via a connection to a network, such as the Internet 162. Through the Internet 162, the device can communicate with a central server or a cloud-computing system 164. The central server or cloud-computing system 164 can be associated with a manufacturer, support entity or service provider associated with the device. For one embodiment, a user may be able to contact customer support using a device itself rather than needing to use other communication means such as a telephone or Internet-connected computer. Further, software updates can be automatically sent from the central server or cloud-computing system 164 to devices (e.g., when available, when purchased, or at routine intervals).

By virtue of network connectivity, one or more of the smart-home devices of FIG. 1 can further allow a user to interact with the device even if the user is not proximate to the device. For example, a user can communicate with a device using a computer (e.g., a desktop computer, laptop computer, or tablet) or other portable electronic device (e.g., a smartphone). A webpage or app can be configured to receive communications from the user and control the device based on the communications and/or to present information about the device's operation to the user. For example, the user can view a current setpoint temperature for a device and adjust it using a computer. The user can be in the structure during this remote communication or outside the structure.

The smart home also can include a variety of non-communicating legacy appliances 140, such as old conventional washer/dryers, refrigerators, and the like which can be controlled, albeit coarsely (ON/OFF), by virtue of the wall plug interfaces 110. The smart home can further include a variety of partially communicating legacy appliances 142, such as IR-controlled wall air conditioners or other IR-controlled devices, which can be controlled by IR signals provided by the hazard detection units 104 or the light switches 108.

Figure 2:
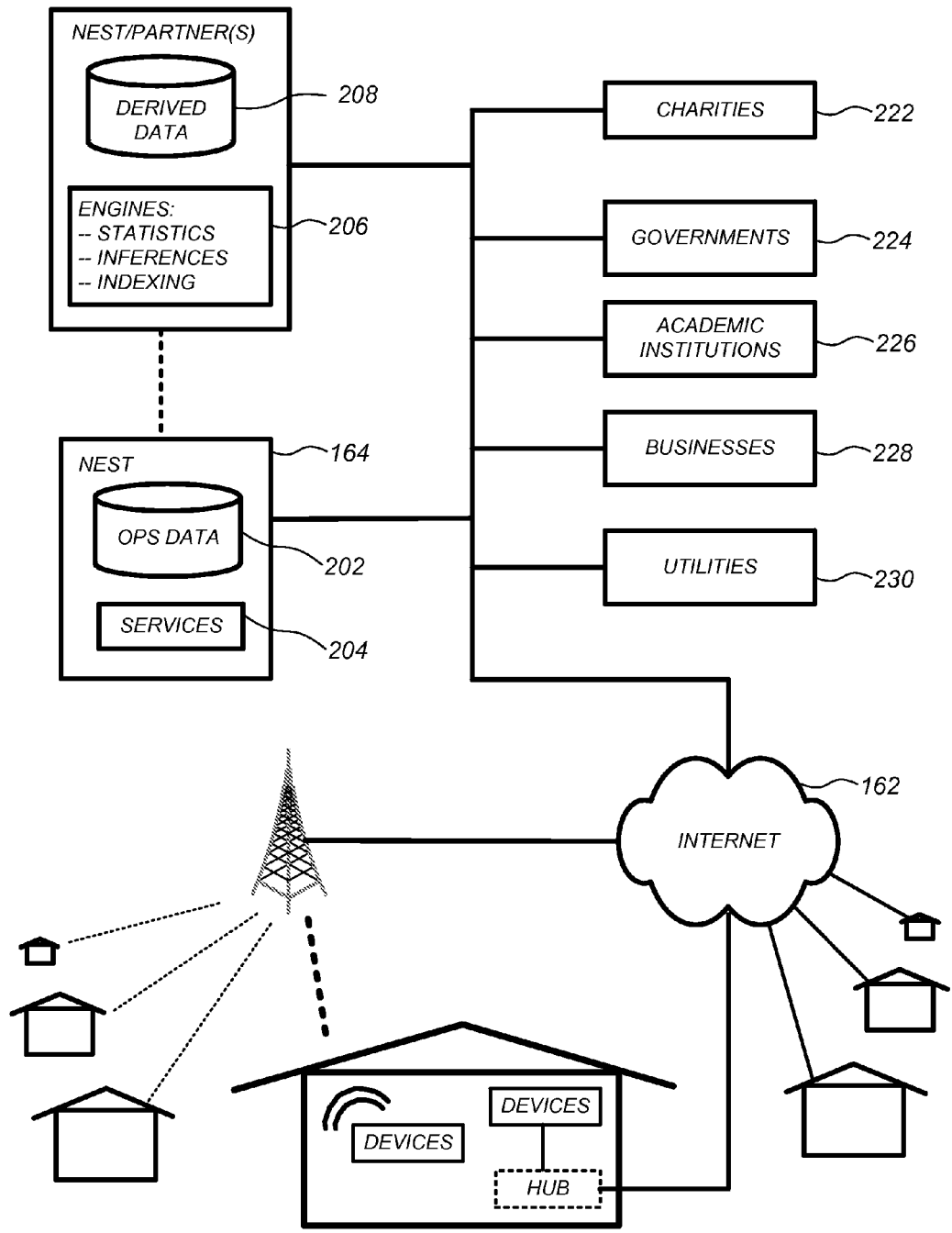
FIG. 2 illustrates a network-level view of an extensible devices and services platform with which the smart home of FIG. 1 can be integrated, according to some embodiments.

FIG. 2 illustrates a network-level view of an extensible devices and services platform with which the smart home of FIG. 1 can be integrated, according to some embodiments. Each of the intelligent, network-connected devices from FIG. 1 can communicate with one or more remote central servers or cloud computing systems 164. The communication can be enabled by establishing connection to the Internet 162 either directly (for example, using 3G/4G connectivity to a wireless carrier), though a hubbed network (which can be scheme ranging from a simple wireless router, for example, up to and including an intelligent, dedicated whole-home control node), or through any combination thereof.

The central server or cloud-computing system 164 can collect operation data 202 from the smart home devices. For example, the devices can routinely transmit operation data or can transmit operation data in specific instances (e.g., when requesting customer support). The central server or cloud-computing architecture 164 can further provide one or more services 204. The services 204 can include, e.g., software update, customer support, sensor data collection/logging, remote access, remote or distributed control, or use suggestions (e.g., based on collected operation data 204 to improve performance, reduce utility cost, etc.). Data associated with the services 204 can be stored at the central server or cloud-computing system 164 and the central server or cloud-computing system 164 can retrieve and transmit the data at an appropriate time (e.g., at regular intervals, upon receiving request from a user, etc.).

One salient feature of the described extensible devices and services platform, as illustrated in FIG. 2, is a processing engines 206, which can be concentrated at a single server or distributed among several different computing entities without limitation. Processing engines 206 can include engines configured to receive data from a set of devices (e.g., via the Internet or a hubbed network), to index the data, to analyze the data and/or to generate statistics based on the analysis or as part of the analysis. The analyzed data can be stored as derived data 208. Results of the analysis or statistics can thereafter be transmitted back to a device providing ops data used to derive the results, to other devices, to a server providing a webpage to a user of the device, or to other non-device entities. For example, use statistics, use statistics relative to use of other devices, use patterns, and/or statistics summarizing sensor readings can be transmitted. The results or statistics can be provided via the Internet 162. In this manner, processing engines 206 can be configured and programmed to derive a variety of useful information from the operational data obtained from the smart home. A single server can include one or more engines.

The derived data can be highly beneficial at a variety of different granularities for a variety of useful purposes, ranging from explicit programmed control of the devices on a per-home, per-neighborhood, or per-region basis (for example, demand-response programs for electrical utilities), to the generation of inferential abstractions that can assist on a per-home basis (for example, an inference can be drawn that the homeowner has left for vacation and so security detection equipment can be put on heightened sensitivity), to the generation of statistics and associated inferential abstractions that can be used for government or charitable purposes. For example, processing engines 206 can generate statistics about device usage across a population of devices and send the statistics to device users, service providers or other entities (e.g., that have requested or may have provided monetary compensation for the statistics). As specific illustrations, statistics can be transmitted to charities 222, governmental entities 224 (e.g., the Food and Drug Administration or the Environmental Protection Agency), academic institutions 226 (e.g., university researchers), businesses 228 (e.g., providing device warranties or service to related equipment), or utility companies 230. These entities can use the data to form programs to reduce energy usage, to preemptively service faulty equipment, to prepare for high service demands, to track past service performance, etc., or to perform any of a variety of beneficial functions or tasks now known or hereinafter developed.

Figure 3:
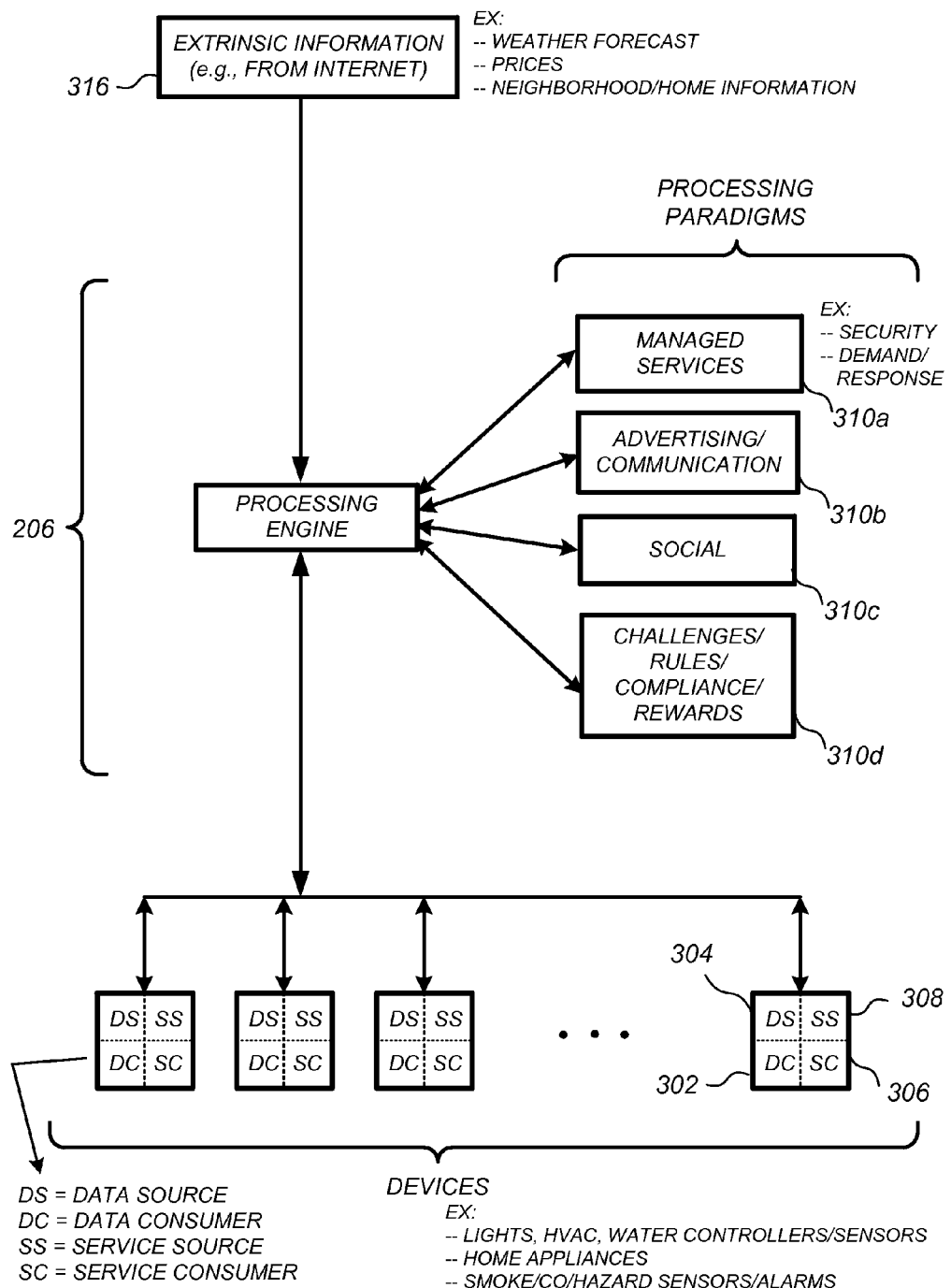
FIG. 3 illustrates an abstracted functional view of the extensible devices and services platform of FIG. 2, according to some embodiments.

FIG. 3 illustrates an abstracted functional view of the extensible devices and services platform of FIG. 2, with particular reference to the processing engine 206 as well as the devices of the smart home. Even though the devices situated in the smart home will have an endless variety of different individual capabilities and limitations, they can all be thought of as sharing common characteristics in that each of them is a data consumer 302 (DC), a data source 304 (DS), a services consumer 306 (SC), and a services source 308 (SS). Advantageously, in addition to providing the essential control information needed for the devices to achieve their local and immediate objectives, the extensible devices and services platform can also be configured to harness the large amount of data that is flowing out of these devices. In addition to enhancing or optimizing the actual operation of the devices themselves with respect to their immediate functions, the extensible devices and services platform can also be directed to "repurposing" that data in a variety of automated, extensible, flexible, and/or scalable ways to achieve a variety of useful objectives. These objectives may be predefined or adaptively identified based on, e.g., usage patterns, device efficiency, and/or user input (e.g., requesting specific functionality).

For example, FIG. 3 shows processing engine 206 as including a number of paradigms 310. Processing engine 206 can include a managed services paradigm 310a that monitors and manages primary or secondary device functions. The device functions can include ensuring proper operation of a device given user inputs, estimating that (e.g., and responding to) an intruder is or is attempting to be in a dwelling, detecting a failure of equipment coupled to the device (e.g., a light bulb having burned out), implementing or otherwise responding to energy demand response events, or alerting a user of a current or predicted future event or characteristic. Processing engine 206 can further include an advertising/communication paradigm 310b that estimates characteristics (e.g., demographic information), desires and/or products of interest of a user based on device usage. Services, promotions, products or upgrades can then be offered or automatically provided to the user. Processing engine 206 can further include a social paradigm 310c that uses information from a social network, provides information to a social network (for example, based on device usage), processes data associated with user and/or device interactions with the social network platform. For example, a user's status as reported to their trusted contacts on the social network could be updated to indicate when they are home based on light detection, security system inactivation or device usage detectors. As another example, a user may be able to share device-usage statistics with other users. Processing engine 206 can include a challenges/rules/compliance/rewards paradigm 310d that informs a user of challenges, rules, compliance regulations and/or rewards and/or that uses operation data to determine whether a challenge has been met, a rule or regulation has been complied with and/or a reward has been earned. The challenges, rules or regulations can relate to efforts to conserve energy, to live safely (e.g., reducing exposure to toxins or carcinogens), to conserve money and/or equipment life, to improve health, etc.

Processing engine can integrate or otherwise utilize extrinsic information 316 from extrinsic sources to improve the functioning of one or more processing paradigms. Extrinsic information 316 can be used to interpret operational data received from a device, to determine a characteristic of the environment near the device (e.g., outside a structure that the device is enclosed in), to determine services or products available to the user, to identify a social network or social-network information, to determine contact information of entities (e.g., public-service entities such as an emergency-response team, the police or a hospital) near the device, etc., to identify statistical or environmental conditions, trends or other information associated with a home or neighborhood, and so forth.

An extraordinary range and variety of benefits can be brought about by, and fit within the scope of, the described extensible devices and services platform, ranging from the ordinary to the profound. Thus, in one "ordinary" example, each bedroom of the smart home can be provided with a smoke/fire/CO alarm that includes an occupancy sensor, wherein the occupancy sensor is also capable of inferring (e.g., by virtue of motion detection, facial recognition, audible sound patterns, etc.) whether the occupant is asleep or awake. If a serious fire event is sensed, the remote security/monitoring service or fire department is advised of how many occupants there are in each bedroom, and whether those occupants are still asleep (or immobile) or whether they have properly evacuated the bedroom. While this is, of course, a very advantageous capability accommodated by the described extensible devices and services platform, there can be substantially more "profound" examples that can truly illustrate the potential of a larger "intelligence" that can be made available. By way of perhaps a more "profound" example, the same data bedroom occupancy data that is being used for fire safety can also be "repurposed" by the processing engine 206 in the context of a social paradigm of neighborhood child development and education. Thus, for example, the same bedroom occupancy and motion data discussed in the "ordinary" example can be collected and made available for processing (properly anonymized) in which the sleep patterns of schoolchildren in a particular ZIP code can be identified and tracked. Localized variations in the sleeping patterns of the schoolchildren may be identified and correlated, for example, to different nutrition programs in local schools.

Figure 4:
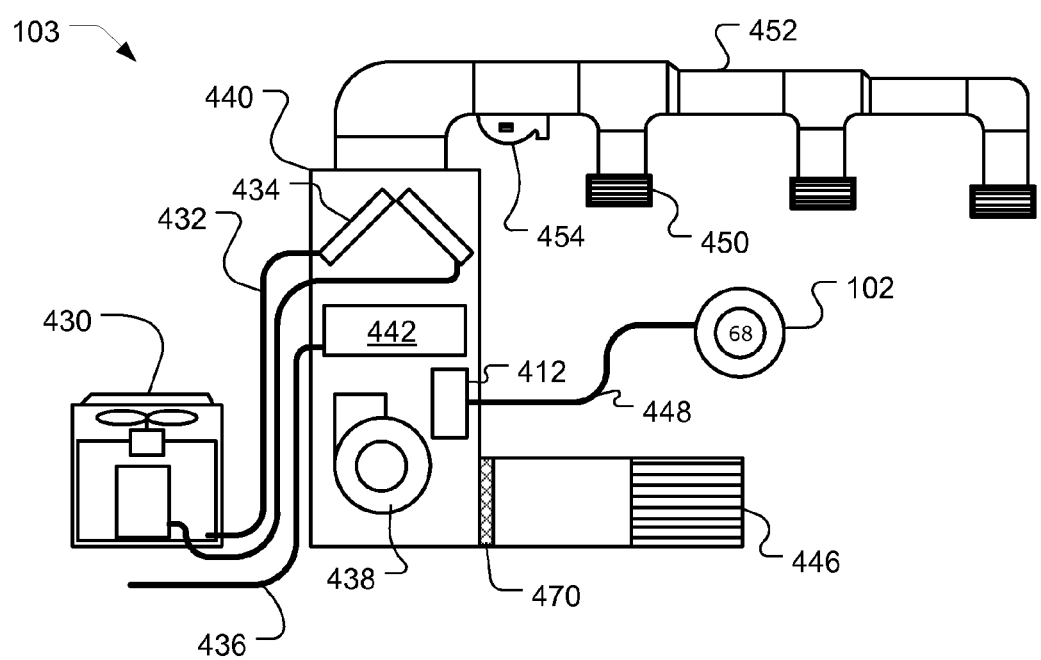
FIG. 4 is a schematic diagram of an HVAC system, according to some embodiments.

FIG. 4 is a schematic diagram of an HVAC system, according to some embodiments. HVAC system 103 provides heating, cooling, ventilation, and/or air handling for an enclosure, such as structure 150 depicted in FIG. 1. System 103 depicts a forced air type heating and cooling system, although according to other embodiments, other types of HVAC systems could be used such as radiant heat based systems, heat-pump based systems, and others.

For carrying out the heating function, heating coils or elements 442 within air handler 440 provide a source of heat using electricity or gas via line 436. Cool air is drawn from the enclosure via return air duct 446 through filter 470, using fan 438 and is heated through heating coils or elements 442. The heated air flows back into the enclosure at one or more locations via supply air duct system 452 and supply air registers such as register 450. In cooling, an outside compressor 430 passes a gas such as Freon through a set of heat exchanger coils and then through an expansion valve. The gas then goes through line 432 to the cooling coils or evaporator coils 434 in the air handler 440 where it expands, cools and cools the air being circulated via fan 438. A humidifier 454 may optionally be included in various embodiments that returns moisture to the air before it passes through duct system 452. Although not shown in FIG. 4, alternate embodiments of HVAC system 103 may have other functionality such as venting air to and from the outside, one or more dampers to control airflow within the duct system 452 and an emergency heating unit. Overall operation of HVAC system 103 is selectively actuated by control electronics 412 communicating with thermostat 102 over control wires 448.

Figure 5A:
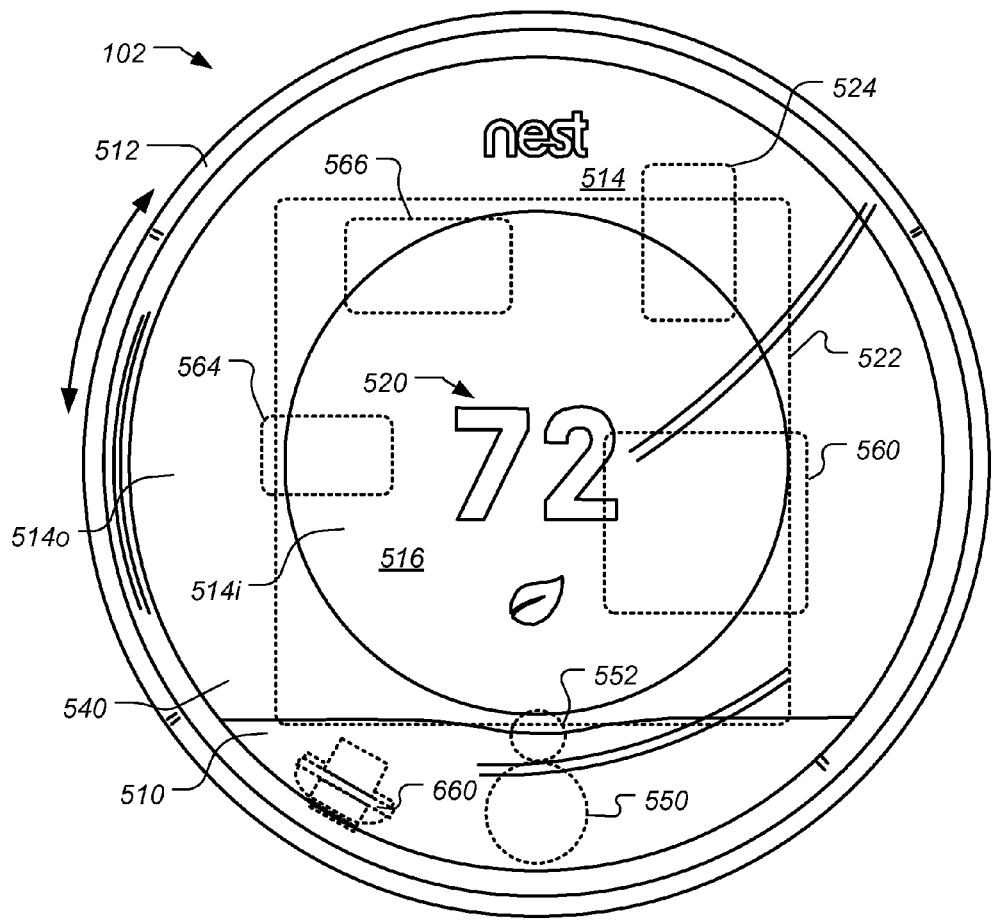
FIGS. 5A-5D illustrate a thermostat having a visually pleasing, smooth, sleek and rounded exterior appearance while at the same time including one or more sensors for detecting occupancy and/or users, according to some embodiments.
Figure 5B:
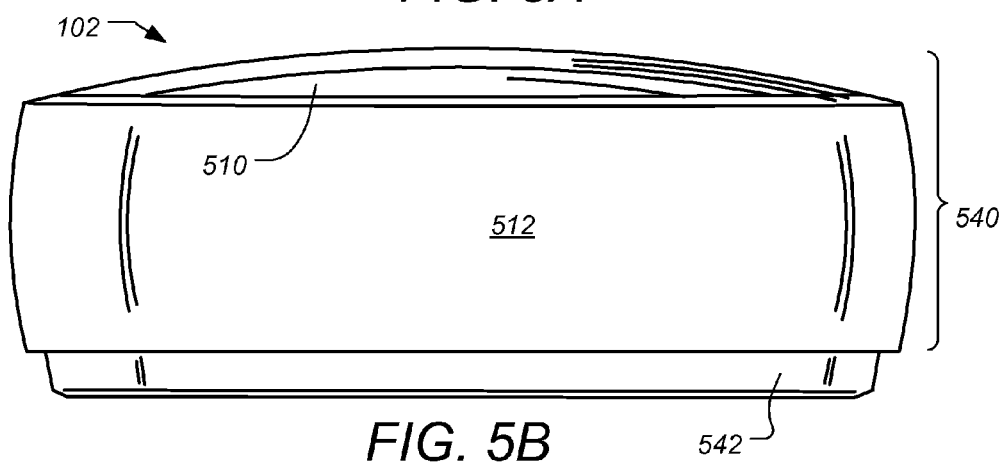
Figure 5C:
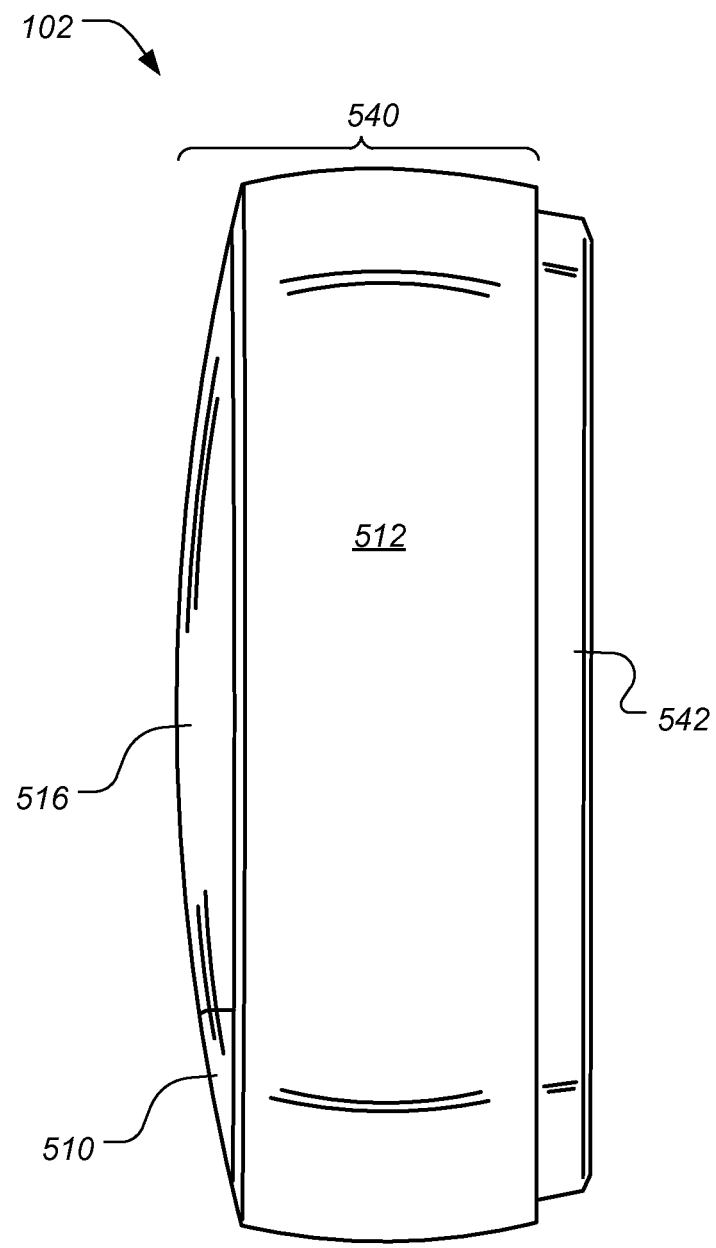
Figure 5D:
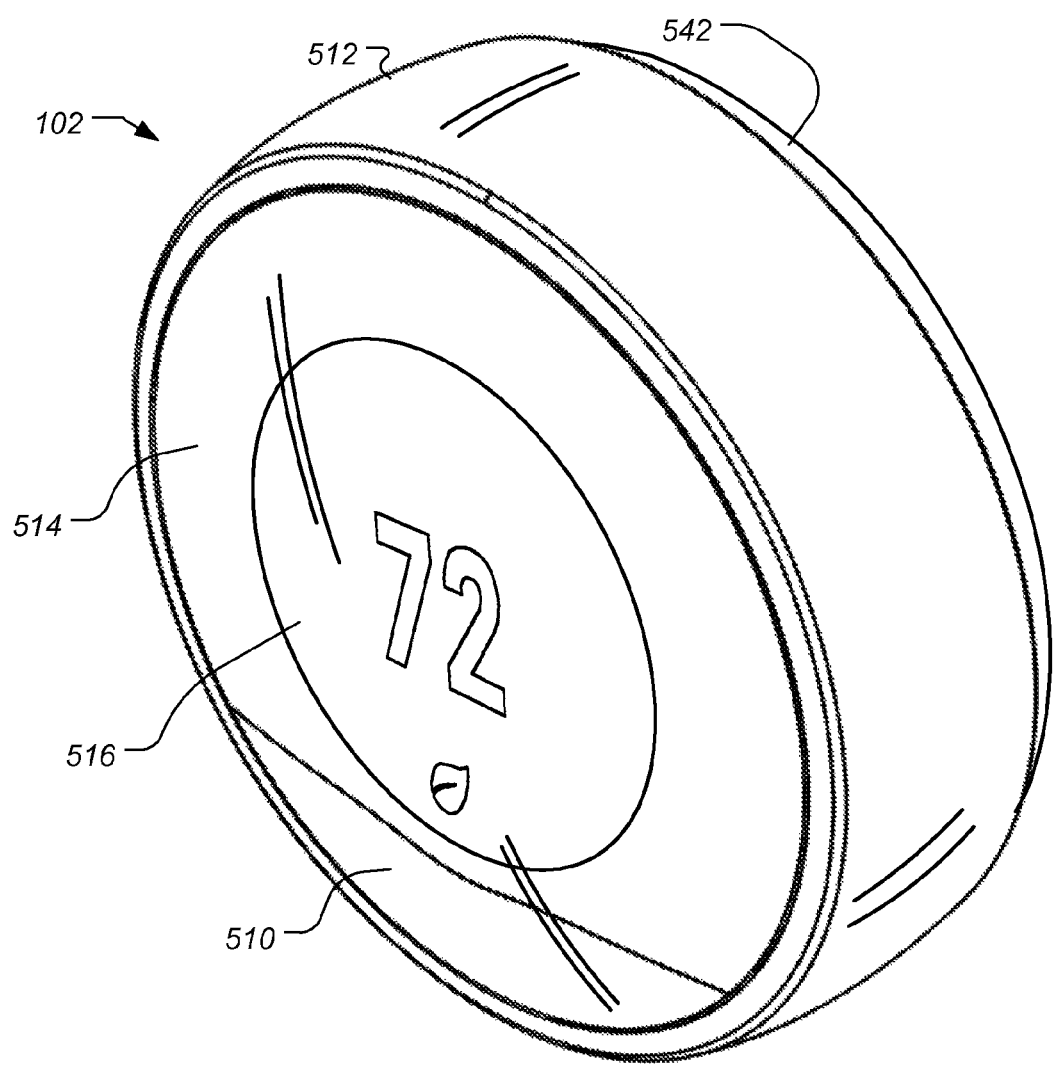

FIGS. 5A-5D illustrate a thermostat having a visually pleasing, smooth, sleek and rounded exterior appearance while at the same time including one or more sensors for detecting occupancy and/or users, according to some embodiments. FIG. 5A is front view, FIG. 5B is a bottom elevation, FIG. 5C is a right side elevation, and FIG. 5D is prospective view of thermostat 102. Unlike many prior art thermostats, thermostat 102 has a sleek, simple, uncluttered and elegant design that does not detract from home decoration, and indeed can serve as a visually pleasing centerpiece for the immediate location in which it is installed. Moreover, user interaction with thermostat 102 is facilitated and greatly enhanced over known conventional thermostats by the design of thermostat 102. The thermostat 102 includes control circuitry and is electrically connected to an HVAC system 103, such as is shown in FIGS. 1-4. Thermostat 102 is wall mountable, is circular in shape, and has an outer rotatable ring 512 for receiving user input. Thermostat 102 is circular in shape in that it appears as a generally disk-like circular object when mounted on the wall. Thermostat 102 has a large convex rounded front face lying inside the outer ring 512. According to some embodiments, thermostat 102 is approximately 80 mm in diameter and protrudes from the wall, when wall mounted, by 32 mm. The outer rotatable ring 512 allows the user to make adjustments, such as selecting a new setpoint temperature. For example, by rotating the outer ring 512 clockwise, the realtime (i.e. currently active) setpoint temperature can be increased, and by rotating the outer ring 512 counter-clockwise, the realtime setpoint temperature can be decreased. The front face of the thermostat 102 comprises a clear cover 514 that according to some embodiments is polycarbonate, and a Fresnel lens 510 having an outer shape that matches the contours of the curved outer front face of the thermostat 102. According to some embodiments, the Fresnel lens elements are formed on the interior surface of the Fresnel lens piece 510 such that they are not obviously visible by viewing the exterior of the thermostat 102. Behind the Fresnel lens is a passive infrared sensor 550 for detecting occupancy, and the Fresnel lens piece 510 is made from a high-density polyethylene (HDPE) that has an infrared transmission range appropriate for sensitivity to human bodies. As shown in FIGS. 5A-5D, the front edge of rotating ring 512, front face 514 and Fresnel lens 510 are shaped such that they together form a, integrated convex rounded front face that has a common outward arc or spherical shape gently arcing outward.

Although being formed from a single lens-like piece of material such as polycarbonate, the cover 514 has two different regions or portions including an outer portion 514o and a central portion 514i. According to some embodiments, the cover 514 is painted or smoked around the outer portion 514o, but leaves the central portion 514i visibly clear so as to facilitate viewing of an electronic display 516 disposed thereunderneath. According to some embodiments, the curved cover 514 acts as a lens that tends to magnify the information being displayed in electronic display 516 to users. According to some embodiments the central electronic display 516 is a dot-matrix layout (i.e. individually addressable) such that arbitrary shapes can be generated, rather than being a segmented layout. According to some embodiments, a combination of dot-matrix layout and segmented layout is employed. According to some embodiments, central display 516 is a backlit color liquid crystal display (LCD). An example of information displayed on the electronic display 516 is illustrated in FIG. 5A, and includes central numerals 520 that are representative of a current setpoint temperature. The thermostat 102 is preferably constructed such that the electronic display 516 is at a fixed orientation and does not rotate with the outer ring 512, so that the electronic display 516 remains easily read by the user. For some embodiments, the cover 514 and Fresnel lens 510 also remain at a fixed orientation and do not rotate with the outer ring 512. According to one embodiment in which the diameter of the thermostat 102 is about 80 mm, the diameter of the electronic display 516 is about 45 mm. According to some embodiments the gently outwardly curved shape of the front surface of thermostat 102, which is made up of cover 514, Fresnel lens 510 and the front facing portion of ring 512, is spherical, and matches a sphere having a radius of between 100 mm and 150 mm. According to some embodiments, the radius of the spherical shape of the thermostat front is about 136 mm.

Motion sensing with PIR sensor 550 as well as other techniques can be used in the detection and/or predict of occupancy, as is described further in the commonly assigned U.S. Ser. No. 12/881,430, which is incorporated herein by reference. According to some embodiments, occupancy information is used in generating an effective and efficient scheduled program. A second downwardly-tilted PIR sensor 552 is provided to detect an approaching user. The proximity sensor 552 can be used to detect proximity in the range of about one meter so that the thermostat 102 can initiate "waking up" when the user is approaching the thermostat and prior to the user touching the thermostat. Such use of proximity sensing is useful for enhancing the user experience by being "ready" for interaction as soon as, or very soon after the user is ready to interact with the thermostat. Further, the wake-up-on-proximity functionality also allows for energy savings within the thermostat by "sleeping" when no user interaction is taking place our about to take place.

According to some embodiments, for the combined purposes of inspiring user confidence and further promoting visual and functional elegance, the thermostat 102 is controlled by only two types of user input, the first being a rotation of the outer ring 512 as shown in FIG. 5A (referenced hereafter as a "rotate ring" or "ring rotation" input), and the second being an inward push on head unit 540 until an audible and/or tactile "click" occurs (referenced hereafter as an "inward click" or simply "click" input). For such embodiments, the head unit 540 is an assembly that includes all of the outer ring 512, cover 514, electronic display 516, and the Fresnel lens 510. When pressed inwardly by the user, the head unit 540 travels inwardly by a small amount, such as 0.5 mm, against an interior metallic dome switch (not shown), and then springably travels back outwardly by that same amount when the inward pressure is released, providing a satisfying tactile "click" sensation to the user's hand, along with a corresponding gentle audible clicking sound. Thus, for the embodiment of FIGS. 5A-5D, an inward click can be achieved by direct pressing on the outer ring 512 itself, or by indirect pressing of the outer ring by virtue of providing inward pressure on the cover 514, lens 510, or by various combinations thereof. For other embodiments, the thermostat 102 can be mechanically configured such that only the outer ring 512 travels inwardly for the inward click input, while the cover 514 and lens 510 remain motionless. It is to be appreciated that a variety of different selections and combinations of the particular mechanical elements that will travel inwardly to achieve the "inward click" input are within the scope of the present teachings, whether it be the outer ring 512 itself, some part of the cover 514, or some combination thereof. However, it has been found particularly advantageous to provide the user with an ability to quickly go back and forth between registering "ring rotations" and "inward clicks" with a single hand and with minimal amount of time and effort involved, and so the ability to provide an inward click directly by pressing the outer ring 512 has been found particularly advantageous, since the user's fingers do not need to be lifted out of contact with the device, or slid along its surface, in order to go between ring rotations and inward clicks. Moreover, by virtue of the strategic placement of the electronic display 516 centrally inside the rotatable ring 512, a further advantage is provided in that the user can naturally focus their attention on the electronic display throughout the input process, right in the middle of where their hand is performing its functions. The combination of intuitive outer ring rotation, especially as applied to (but not limited to) the changing of a thermostat's setpoint temperature, conveniently folded together with the satisfying physical sensation of inward clicking, together with accommodating natural focus on the electronic display in the central midst of their fingers' activity, adds significantly to an intuitive, seamless, and downright fun user experience. Further descriptions of advantageous mechanical user-interfaces and related designs, which are employed according to some embodiments, can be found in U.S. Ser. Nos. 13/033,573, 29/386,021, and 13/199,108, all of which are incorporated herein by reference.

FIGS. 5B and 5C are bottom and right side elevation views of the thermostat 102, which has been found to provide a particularly pleasing and adaptable visual appearance when viewed against a variety of different wall colors and wall textures in a variety of different home environments and home settings. While the thermostat itself will functionally adapt to the user's schedule as described herein and in one or more of the commonly assigned incorporated applications, the outer shape is specially configured to convey a "chameleon" quality or characteristic such that the overall device appears to naturally blend in, in a visual and decorative sense, with many of the most common wall colors and wall textures found in home and business environments, at least in part because it will appear to assume the surrounding colors and even textures when viewed from many different angles.

According to some embodiments, the thermostat 102 includes a processing system 560, display driver 564 and a wireless communications system 566. The processing system 560 is adapted to cause the display driver 564 and display 516 to display information to the user, and to receiver user input via the rotatable ring 512. The processing system 560, according to some embodiments, is capable of carrying out the governance of the operation of thermostat 102 including various user interface features. The processing system 560 is further programmed and configured to carry out other operations as described further hereinbelow and/or in other ones of the commonly assigned incorporated applications. For example, processing system 560 is further programmed and configured to maintain and update a thermodynamic model for the enclosure in which the HVAC system is installed, such as described in U.S. Ser. No. 12/881,463, and in International Patent App. No. PCT/US11/51579, both of which are incorporated herein by reference. According to some embodiments, the wireless communications system 566 is used to communicate with devices such as personal computers and/or other thermostats or HVAC system components, which can be peer-to-peer communications, communications through one or more servers located on a private network, or and/or communications through a cloud-based service.

According to some embodiments, for ease of installation, configuration and/or upgrading, especially by a non-expert installer such as a user, the thermostat 102 includes a head unit 540 and a backplate (or wall dock) 542. As is described hereinabove, thermostat 102 is wall mounted and has circular in shape and has an outer rotatable ring 512 for receiving user input. Head unit 540 of thermostat 102 is slidably mountable onto back plate 542 and slidably detachable therefrom. According to some embodiments the connection of the head unit 540 to backplate 542 can be accomplished using magnets, bayonet, latches and catches, tabs or ribs with matching indentations, or simply friction on mating portions of the head unit 540 and backplate 542. Also shown in FIG. 5A is a rechargeable battery 522 that is recharged using recharging circuitry 524 that uses power from backplate that is either obtained via power harvesting (also referred to as power stealing and/or power sharing) from the HVAC system control circuit(s) or from a common wire, if available, as described in further detail in co-pending patent application U.S. Ser. Nos. 13/034,674, and 13/034,678, which are incorporated by reference herein. According to some embodiments, rechargeable battery 522 is a single cell lithium-ion, or a lithium-polymer battery.

Figure 6A:
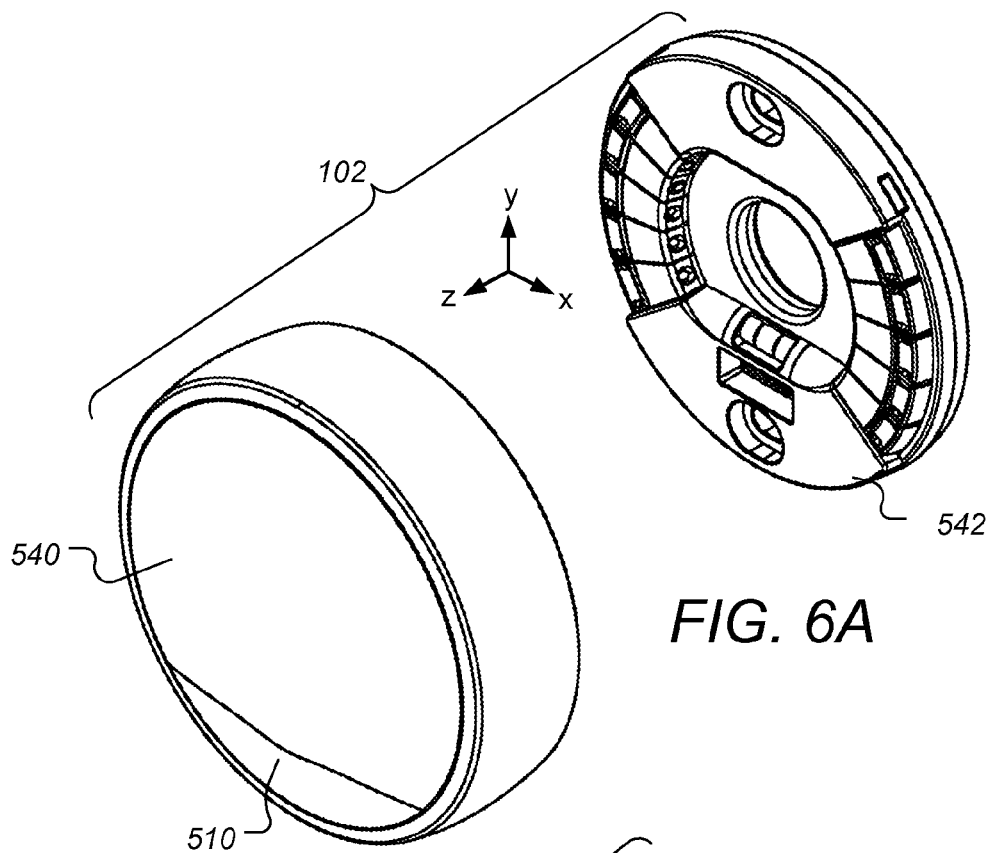
FIGS. 6A-6B illustrate exploded front and rear perspective views, respectively, of a thermostat with respect to its two main components, according to some embodiments.
Figure 6B:
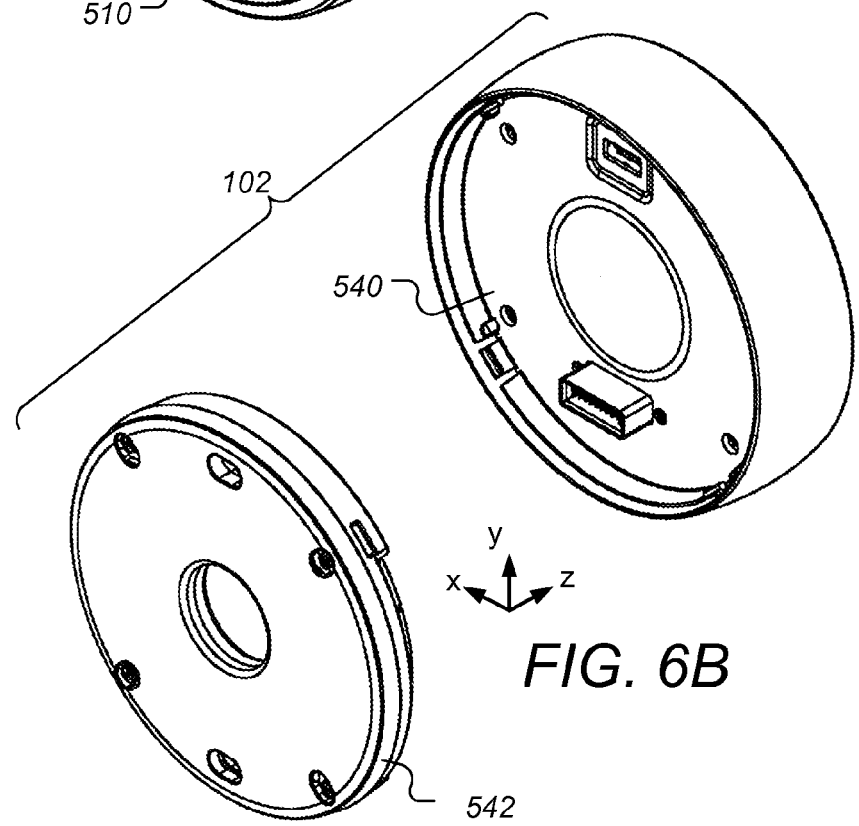

FIGS. 6A-6B illustrate exploded front and rear perspective views, respectively, of the thermostat 102 with respect to its two main components, which are the head unit 540 and the backplate 542. Further technical and/or functional descriptions of various ones of the electrical and mechanical components illustrated hereinbelow can be found in one or more of the commonly assigned applications, such as U.S. Ser. No. 13/199,108, incorporated herein by reference. In the drawings shown herein, the "z" direction is outward from the wall, the "y" direction is the toe-to-head direction relative to a walk-up user, and the "x" direction is the user's left-to-right direction.

Figure 6C:
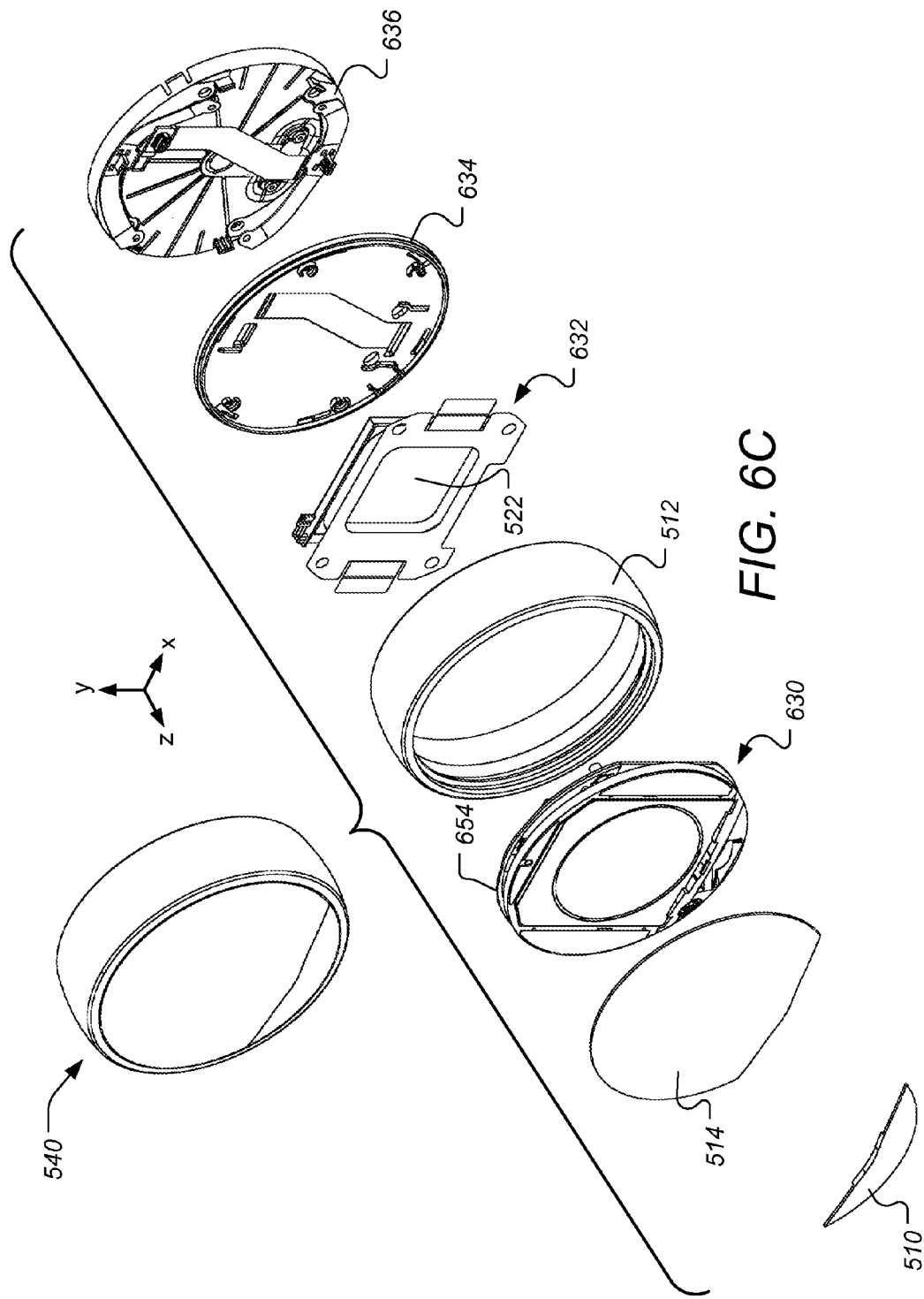
FIGS. 6C-6D illustrate exploded front and rear perspective views, respectively, of a head unit with respect to its primary components, according to some embodiments.
Figure 6D:
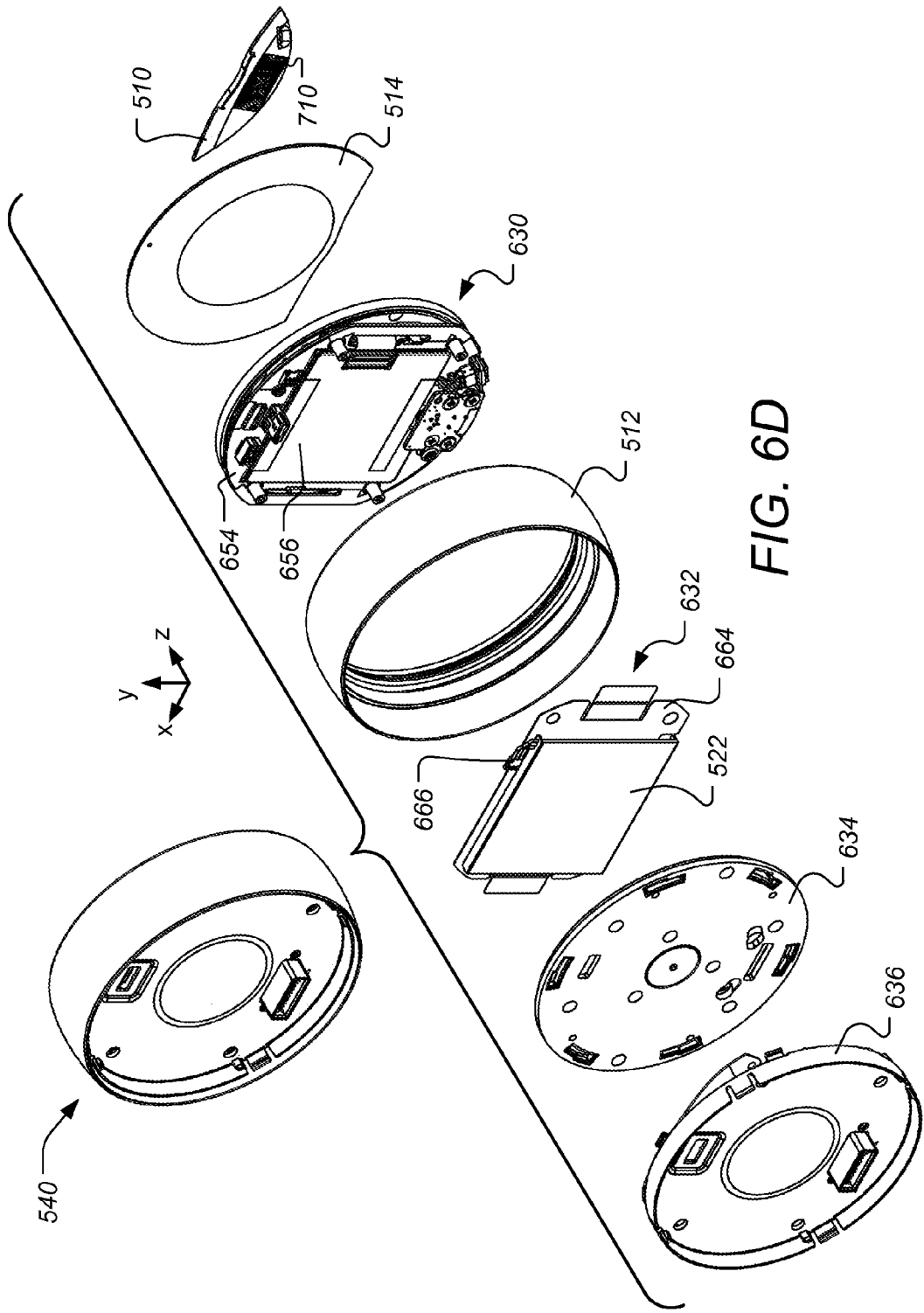

FIGS. 6C-6D illustrate exploded front and rear perspective views, respectively, of the head unit 540 with respect to its primary components. Head unit 540 includes, back cover 636, bottom frame 634, battery assembly 632, the outer ring 512 (which is manipulated for ring rotations), head unit frontal assembly 630, front lens 514, and Fresnel lens 510. Electrical components on the head unit frontal assembly 630 can connect to electrical components on the back plate 542 by virtue of ribbon cables and/or other plug type electrical connectors on back cover 636. Head unit frontal assembly 630 is secured to head unit back cover 636 and bottom frame 634 via four bosses. The outer ring 512 is thereby held between a bearing surface on the head unit top frame 652 (shown in FIGS. 6E and 6F, infra) and bearing surfaces on the bottom frame 634. In particular motion of the ring 512 in z direction is constrained by flat bearing surfaces on the top frame 652 and bottom frame 634, while motion of the ring in x and y directions are constrained by circular rounded surfaces on the bottom frame 634. According to some embodiments, the bearing surfaces of the bottom frame 634 and/or the top frame 652 are greased and/or otherwise lubricated to both smooth and dampen rotational movement for ring 512. Attached to top frame 652 is the head unit printed circuit board (PCB) 654 on which much of the head unit circuitry is mounted including some or all of processing system 560, display driver 564, wireless communication system 566 and battery recharging circuitry 524 as shown and described with respect to FIG. 5A, as well as one or more additional memory storage components. According to some embodiments, circuitry and components are mounted on both sides of PCB 654. A shielding can 656 (visible in FIG. 6D) surrounds most or all of the head unit circuitry and components on PCB 654 and serves to shield the circuitry and components from electromagnetic interference. Although not visible, according to some embodiments, shielding can 656 surrounds circuitry and components on both sides of PCB 654.

Battery assembly 632 includes a rechargeable Lithium-Ion battery 522, which for one preferred embodiment has a nominal voltage of 3.7 volts and a nominal capacity of 560 mAh. To extend battery life, however, the battery 522 is normally not charged beyond 450 mAh by the thermostat battery charging circuitry. Moreover, although the battery 522 is rated to be capable of being charged to 4.2 volts, the thermostat battery charging circuitry normally does not charge it beyond 3.95 volts. Battery assembly 632 also includes connecting wires 666, and a battery mounting film 664 that is attached to battery 522 using a strong adhesive and to the rear shielding can 656 of head unit PCB 654 using a relatively weaker adhesive. By using a weaker adhesive to mount the film 664 of battery assembly 632 to shielding can 656 of the PCB 654, subsequent replacement of battery assembly 632 (including battery 522) is facilitated. According to some embodiments, the battery assembly 632 is user-replaceable.

Figure 6E:
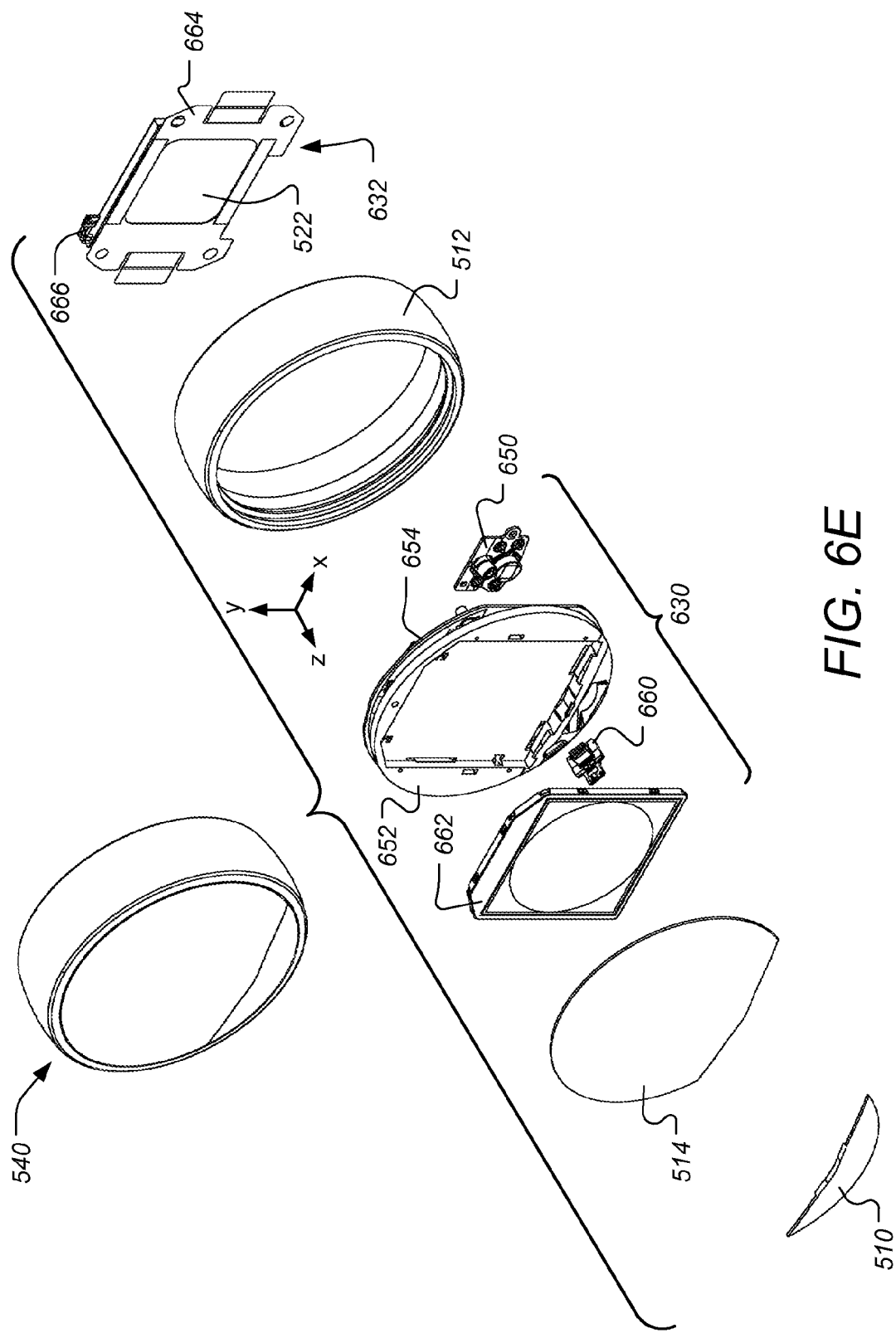

FIGS. 6E-6F illustrate exploded front and rear perspective views, respectively, of the head unit frontal assembly 630 with respect to its primary components. Head unit frontal assembly 630 comprises a head unit top frame 652, head unit PCB 654, and LCD module 662. Daughter board 660 connects to the head unit PCB 654 and includes an optical finger navigation (OFN) module that is configured and positioned to sense rotation of the outer ring 512. The OFN module is directed radially outwardly (that is, perpendicular to the z-axis and away from the center of the thermostat). The OFN module uses methods analogous to the operation of optical computer mice to sense the movement of a textured surface on an inner face of the outer ring 512. Notably, the OFN module is one of the very few sensors that is controlled by the relatively power-intensive head unit microprocessor rather than the relatively low-power back plate microprocessor. This is achievable without excessive power drain implications because the head unit microprocessor will invariably be awake already when the user is manually turning the dial, so there is no excessive wake-up power drain anyway. Advantageously, very fast response can also be provided by the head unit microprocessor. Also visible in FIGS. 6E and 6F is Fresnel lens 510 that operates in conjunction with two PIR motion sensors mounted on PIR board 650. Two or more temperature sensors are also located in the head unit 540 and cooperate to acquire reliable and accurate room temperature data. One of the temperature sensors is located on daughter board 660 and the other is mounted on the head unit PCB 654.

FIGS. 6G-6H illustrate exploded front and rear perspective views, respectively, of the back plate unit 542 with respect to its primary components, according to some embodiments. Back plate unit 542 comprises a back plate rear plate 682, a back plate circuit board 680, and a back plate cover 670. Visible in FIG. 6G are the HVAC wire connectors 684 that include integrated mechanical wire insertion sensing circuitry, and relatively large capacitors 686 that are used by part of the power stealing circuitry that is mounted on the back plate circuit board 680. According to some embodiments, backplate 542 includes electronics and a temperature/humidity sensor in housing. Wire connectors 684 are provided to allow for connection to HVAC system wires, which pass though the large central circular opening 690, which is visible in each of the backplate primary components. Also visible in each of the backplate primary components are two mounting holes 692 and 694 for use in fixing the backplate to the wall. The single top wall-mounting hole 692 on backplate has been found to allow for self-leveling during installation, thereby further enhancing the ease of a non-expert installation of the thermostat 102. Also visible in FIGS. 6G and 6H are bubble level 672 and holder 674 for further facilitating user-installability of the thermostat 102.

Figure 7A:
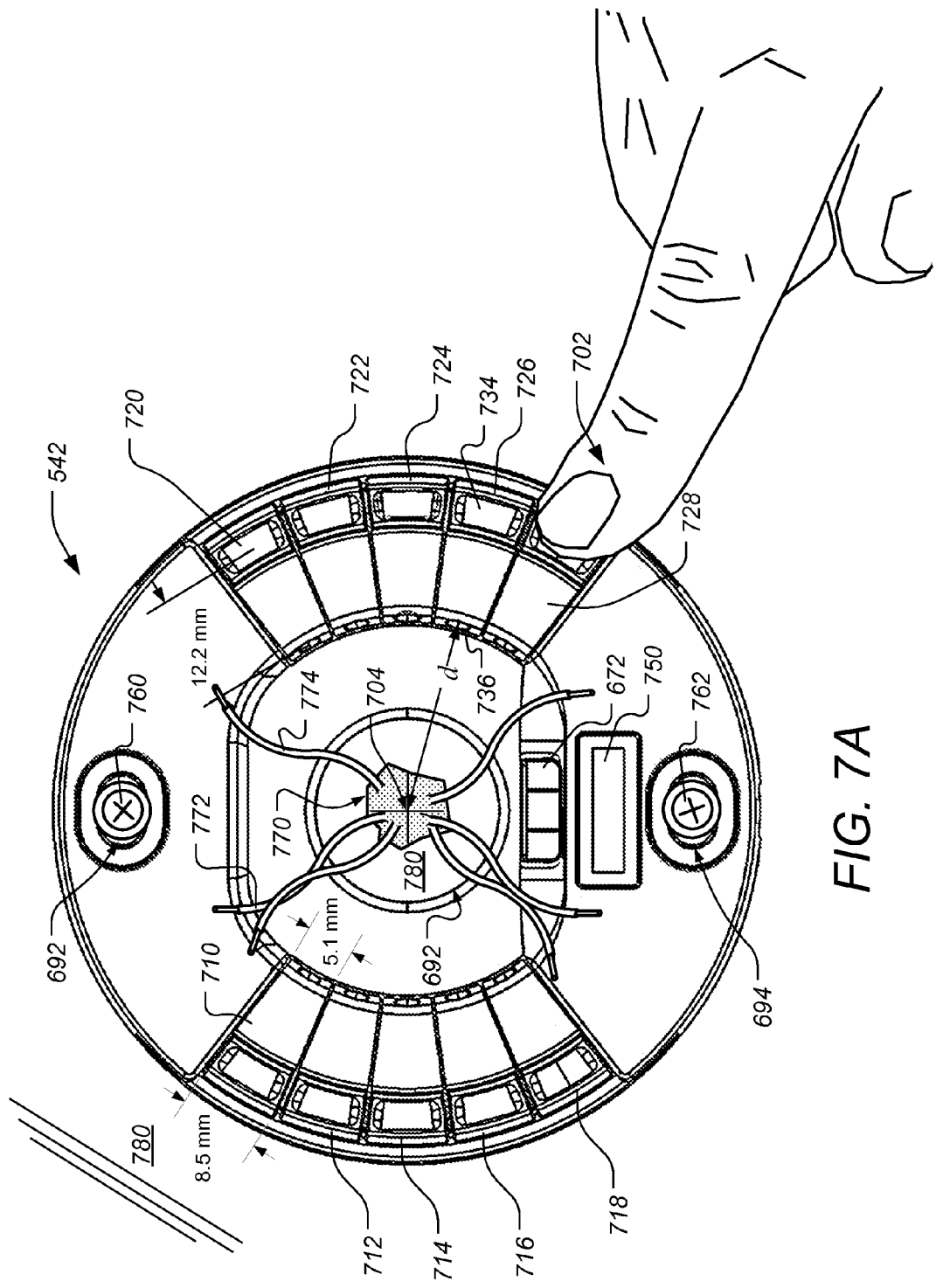
FIGS. 7A-7B are diagrams showing a thermostat backplate having a plurality of user-friendly tool-free wiring terminals, according to some embodiments.
Figure 7B:
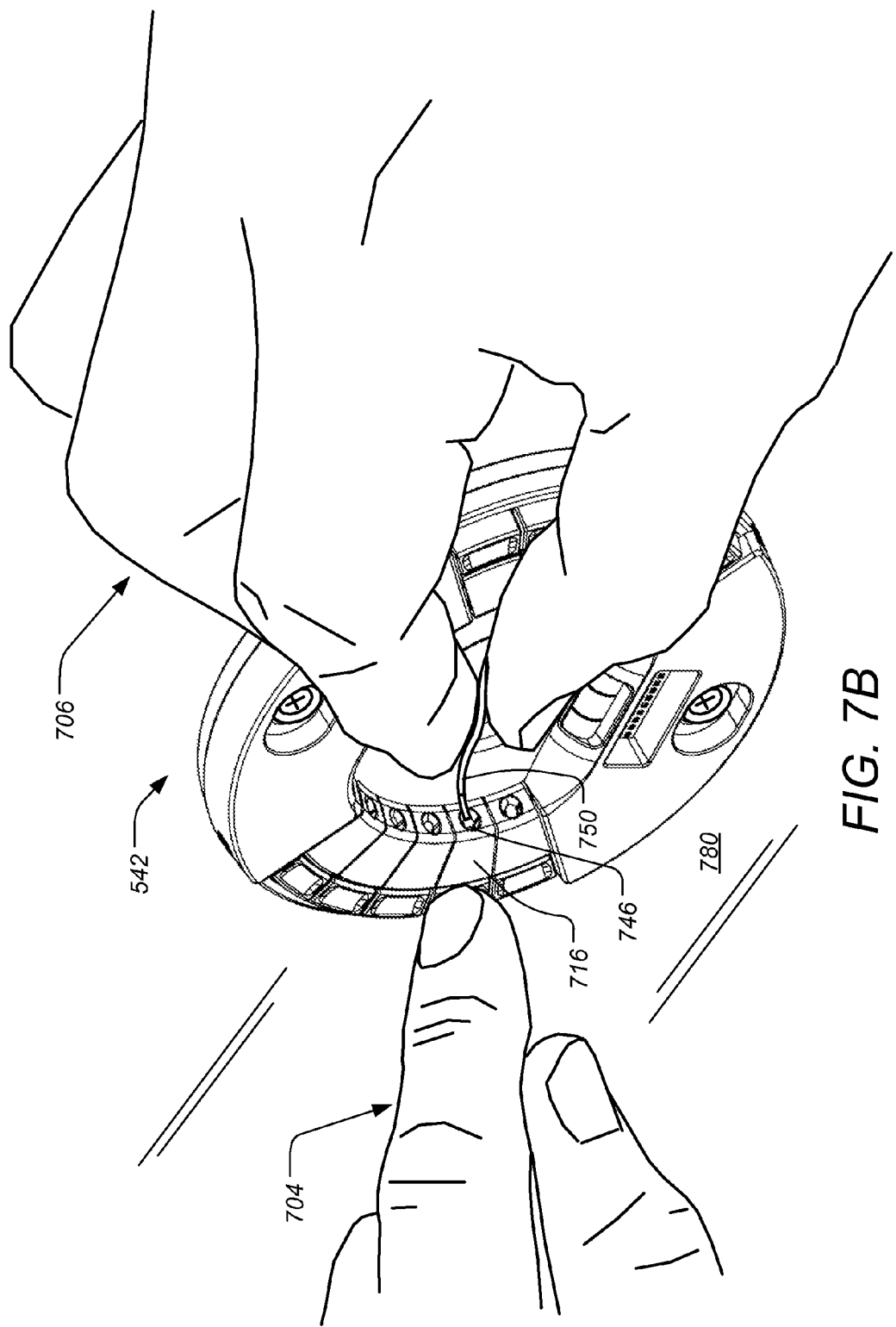

FIGS. 7A-7B are diagrams showing a thermostat backplate having a plurality of user-friendly tool-free wiring terminals, according to some embodiments. For ease of installation, as described supra, the thermostat 102 is separable into a head unit 540 and backplate 542. Shown in FIG. 7A is a plan view of backplate 542 which has been configured for easy installation by a non-expert installer, such as an end-user. Back plate 542 includes two banks of HVAC wire connectors, which together provide capability for tool-free connection to up to 10 HVAC system wires. A semi-circularly arranged left bank includes 5 connectors 710, 712, 714, 716 and 718. Likewise, a semi-circularly arranged right bank includes 5 connectors 720, 722, 724, 726 and 728. Although 10 wiring connectors are shown in the embodiments of FIG. 7A, other numbers of connectors (for example 6, 8 or 12 connectors) can be similarly arranged in banks of circular arrangements. A large central opening 692 is provided through which the HVAC wires can pass when backplate 542 is wall mounted. As shown in FIG. 7A, the backplate is mounted using two screw fasteners 760 and 762 passing through backplate mounting holes 692 and 694 respectively and anchored into wall 780. A number of HVAC system wires, for example wires 772 and 774 are shown protruding through wall hole 770 and through backplate central opening 692. By arranging the connectors along an arc close to the outer periphery of the backplate 542, a relatively large number of wiring connectors can be accommodated, with each individual connector still being large enough to allow for ease of making electrical connection with HVAC wires by a non-expert without the use of tools. In particular, each wiring connector has a spring loaded pushable button which allows for an HVAC wire to be inserted into a wire hole. For example, connector 726 has a spring loaded button 734 and a wire hole 736. When the button is released, the spring action within the connectors a wire securely grasps the wire inserted in the wire hole. Each connector is wedge shaped as shown, with the button end being wider than the wire-hole end. In the examples shown, the button end of the connector is 8.5 mm in width and the wire-hole end is 5.1 mm in width. In the embodiment shown, each connector occupies 15.3 degrees of an arc on the backplate 542, however, it has been found that connector widths of between 10-20 degrees of arc to be suitable for many applications. Another important dimension from a usability standpoint has been found to be the distance from the button surface to the wire insertion location (the wire hole). If the button to wire-hole distance is too short, it has been found that many users have difficulty in installation because the finger used to press the button tends to block a good view of the wire hole. In the embodiments shown the distance from the button center to the wire hole is 12.2 mm.

By arranging the buttons in an arc-shaped pattern close to the outer periphery of backplate 542, and by shaping each connecter in a wedge-like shape, the surface area of the buttons can be maximized since there is more room for each button when the connectors are shaped and arranged as shown. Additionally, it has been found that it is easier for many users to press a button that is very close to the periphery of a backplate device, especially located close to the left and right edges when wall-mounting a thermostat. HVAC system wires, such as wires 772 and 774 are commonly 18 gauge solid (18 AWG or 1.024 mm diameter). As a result the wires protruding from the hole in the wall are rather stiff and may be difficult to bend and otherwise manipulate. By passing the HVAC wires through a central opening 692 and arranging the connectors close to the outer periphery of backplate 542 and positioning the wire holes in an arc-shaped pattern surrounding the central opening, more space is allowed the user to bend the HVAC wires. The distance d from the center 704 of the central opening 692 (and of the backplate 542) to the wire hole in each connector is 21 mm. Also, since the wire holes are arranged in a circular pattern around the central opening 692, the distance d from the wire hole to the center of the backplate is equal for each connector, thereby aiding the installation of many wires being the same length protruding from wall 780 from the same hole 770. The radial direction between the hole 770 and the wire holes of the conductors also allows for few and less complicated bending of the HVAC wires during installation, since each hole is directly facing the hole 770. Thus, for many reasons, the placement, shape orientation and arrangement of the connectors on the backplate 542 has been found to greatly increase the user install ability of the thermostat. An example of user's finger 702 is shown pressing the button of connector 728.

FIG. 7B is a perspective view of a backplate being installed on a wall, according to some embodiments. The backplate 542 is shown attached to surface of wall 780. The user has a left hand 704 that is pressing the button of connector 716 while a right hand 706 is inserting a wire 750 into the wire hole 746 of wiring connector 716. Note that due to the adequate distance between the button and wire hole of the connector, the user's finger used to press the button does not block the user's view of the wire hole. It has been found that the combination of pressing a spring loaded button and inserting the wire in a wire hole is much easier for non-expert installers than conventional screw-type wire terminals which require carefully holding a wire in place while positioning and turning a relatively small sized screw driver.

Figure 8D:
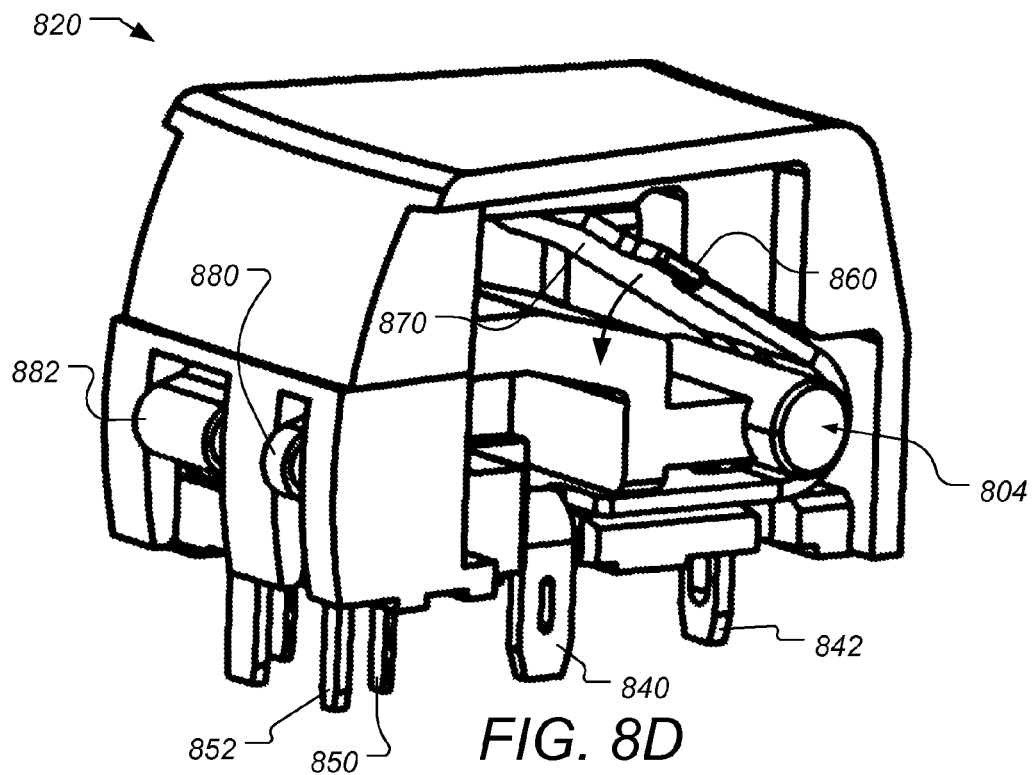

FIGS. 8A-8E are perspective views showing further details of a tool-free thermostat wiring connector, according to some embodiments. Shown in FIG. 8A is one wiring connector 800 of the ten shown mounted on backplate 542 in FIGS. 7A-7B. The wiring connector 800 has a large button surface 810 formed on a lever 802 that pivots about rotational axis 804. The pivoting motion, shown in the solid arrows, is in relation to the connector body 820 which is attached to the backplate circuit board both physically and electrically by a number of pins, of which 840, 842, 850 and 852 are visible. The wire insertion hole 830 is shown, and as described, supra, the button center to wire hole distance is 12.2 mm.

FIGS. 8B-8C are perspective views of the lever 802 and connector body 820, respectively. The lever 802 includes a button surface 810 and two lever arms that rotatably engage with two posts on the connector housing 820. Near button 810 is a surface 812 that engages curved portions of one or more protruding conducing members on the connector body 820 such that the presence of a wire can be mechanically detected. Lever 802 also includes two slotted holes 862 and 864 for accepting two protrusions on the spring conductor of the housing 820, of which one protrusion, 860, is visible in FIG. 8C. By making the lever 802 relatively long, as with the design shown, a user can easily compress a relatively strong spring used to securely hold a HVAC wire in place. In the example shown, lever 802 is 11.5 mm measured from the center of the button 810 to the axis 804, and 13.6 mm from the outer upper edge to the pivot axis 804.

Figure 8E:
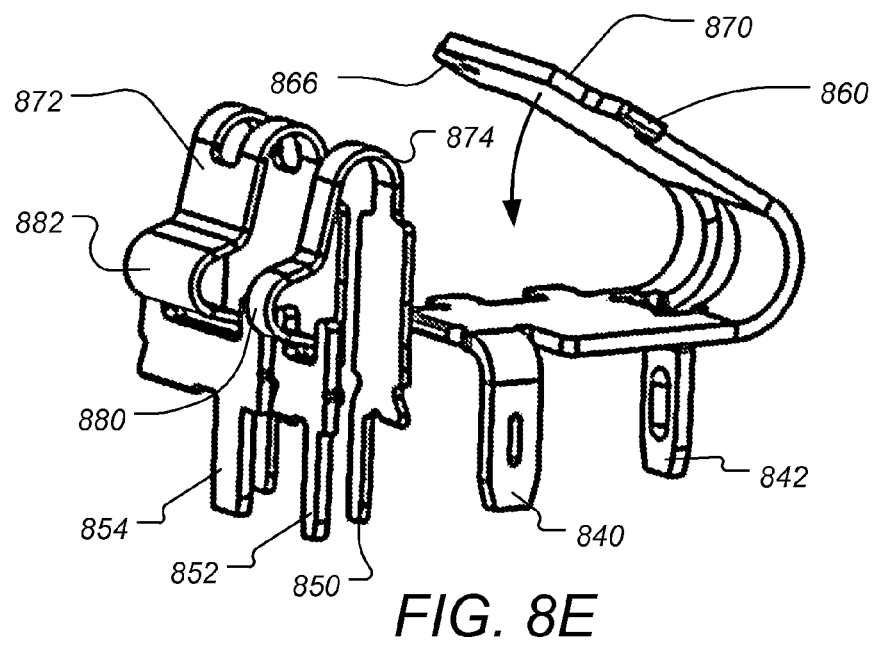

FIGS. 8D-8E are rear perspective views of connector body 820 and of inner conductors 870, 872 and 874. From these views, the protrusions 880 and 882 of conductors 874 and 872, respectively, can be seen that are engaged by the surface 812 of lever 802 (shown in FIG. 8B). Also visible is spring conductor 870 that makes electrical contact with an inserted wires, and extends downwards to two connection pins 840 and 842. The spring conductor 870 is also used to provide spring bias to the lever 802 through engagement of two protrusions 860 and 866 to the to slotted holes 862 and 864 on lever 802, respectively (shown in FIG. 8B). According to some embodiments, the spring conductor 870 is made from a copper titanium allow to allow for both good spring and conductive properties. Conductor 874 is bent such that it normally makes electrical contact with pin and conductor 852, unless the protrusion 880 is engaged by surface 812 of lever 802. Similarly, the conductor 872 is bent such that it normally makes electrical contact with pin 854, unless it is engaged by surface 812 of lever 802. Thus in the arrangement shown, pins 850 and 852 are electrically connected to each other unless the lever 802 is in a depressed state, such as when a wire is inserted in the connector, so as allow for mechanical detection of the inserted wire for example by measuring impedance between pins 850 and 852.

Figure 9A:
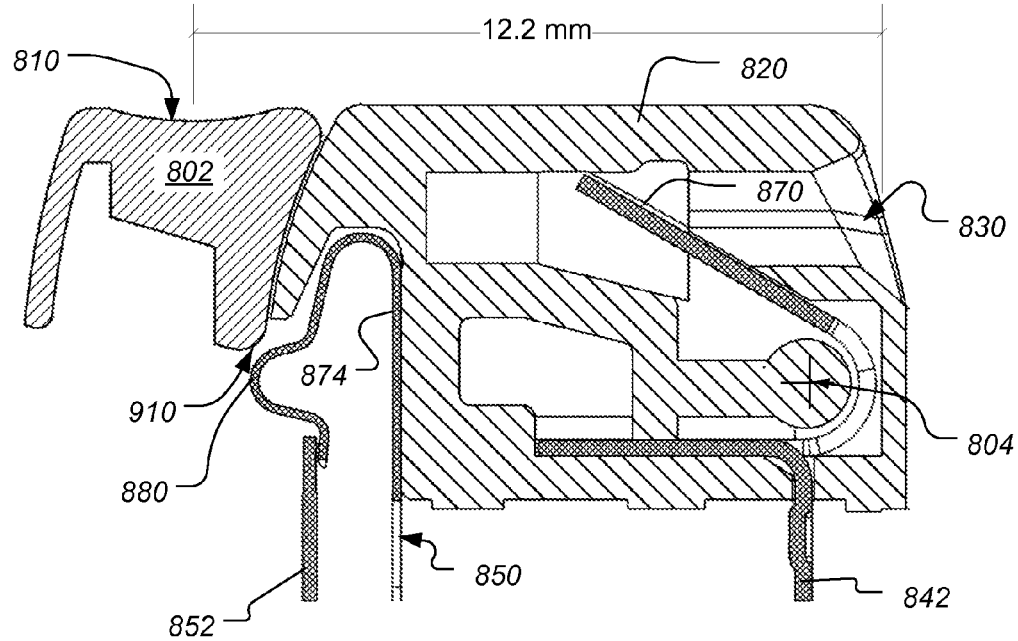
FIGS. 9A-9B are cross sections of a connector showing the interactions of various components, according to some embodiments.
Figure 9B:
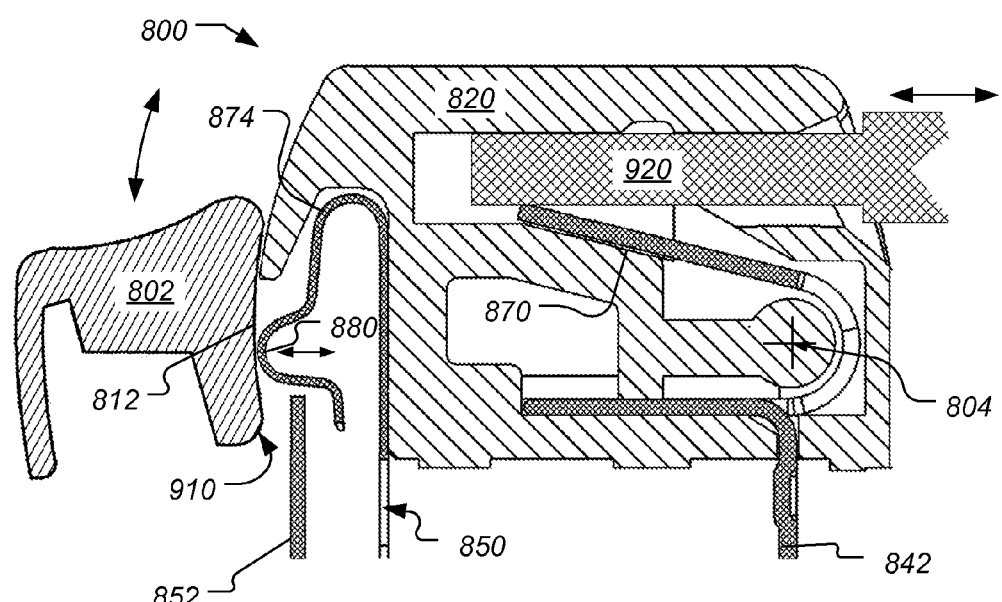

FIGS. 9A-9B are cross sections of the connector 800 showing the interactions of various components, according to some embodiments. Specifically, FIG. 9A is a cross section without a wire inserted and FIG. 9B is a cross section showing a wire 920 inserted. In FIG. 9A, the spring conductor urges lever 802 to the uppermost position shown though engagement of the protrusions 860 and 866 and slotted holes 862 and 864 shown in FIGS. 8B and 8E. When a wire 920 is inserted, the spring conductor 870 is pushed downwards as shown and serves to both securely hold and make electrical contact with wire 920 as shown. The electrical connection is thus made between the inserted wire 920 and pins 840 and 842 (of which only pin 840 is visible in FIG. 9B). When spring conductor 870 is in its compressed state, as shown in FIG. 9B, lever 802 is also held in a depressed state, though the engagement of the protrusions 860 and 866 and slotted holes 862 and 864 shown in FIGS. 8B and 8E. When the lever 802 is in a depressed state, as shown in FIG. 9B, its surface 812 engages protrusion 880 of conductor 874 such that electrical contact with pin 852 is broken. Thus the mechanical presence of an inserted wire is used to open the connection between pins 850 and 852. Note that the leading lower edge 910 of lever 802 is rounded so as to smoothly push against protrusion 880 of conductor 874 when button 810 is pressed by a user. Note that although in FIGS. 9A-9B only a single set of pins 850 and 852 are visible that are used to detect the presence of an inserted wire, additional pairs of pins can be provided, depending on the expected purpose of the inserted wire.

Figure 10A:
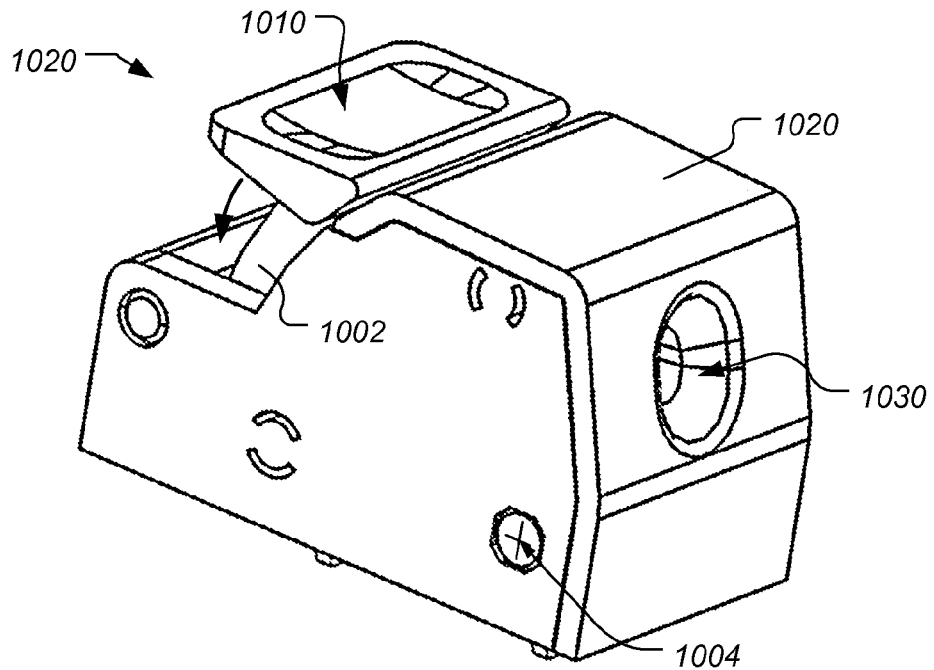
FIGS. 10A-10B show perspective and cross section views showing a tool-free thermostat wiring connector, according to some alternative embodiments.
Figure 10B:
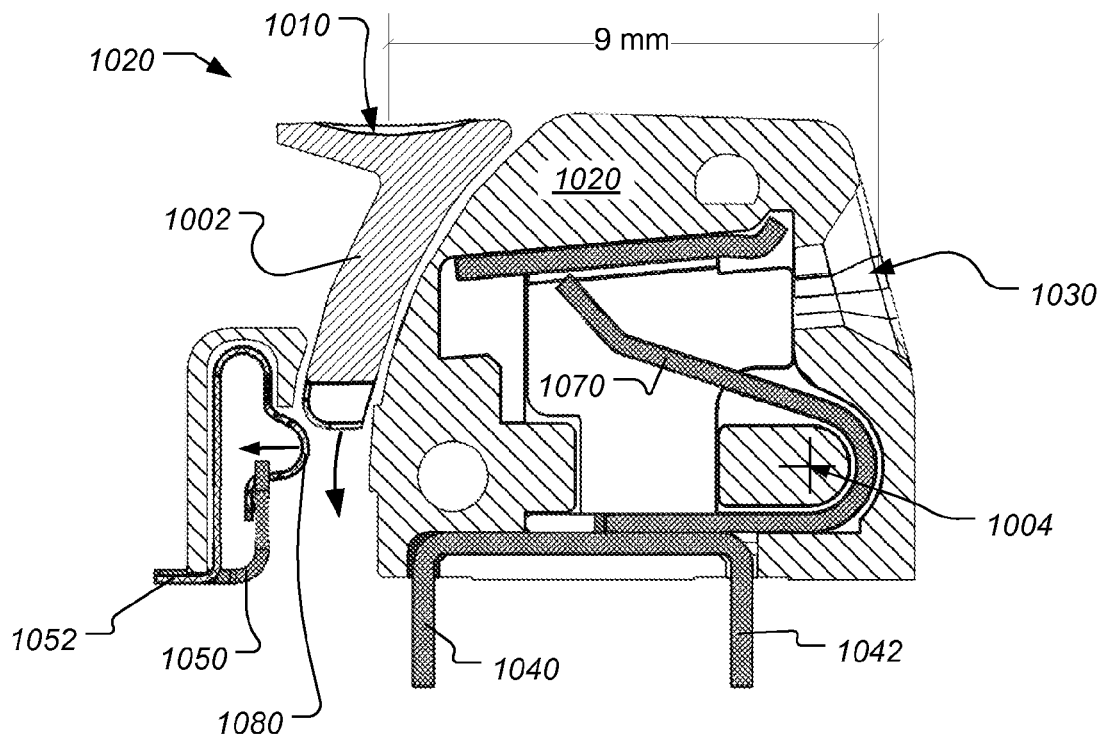

FIGS. 10A-10B show perspective and cross section views showing a tool-free thermostat wiring connector, according to some alternative embodiments. In this case, connector 1020 is rectangular rather than being wedge shaped. The button is biased in the upwards position (shown in FIGS. 10A and 10B), by the spring conductor 1070. In operation, button 1010 is depressed by a user's finger and a wire is inserted in wire hole 1030. The button 1010 is attached via a lever so as to pivot about pivot axis 1004. Pushing the button 1010 also brings button body 1002 into engagement with a protrusion on bent conductor 1052 and served to break the electrical connection between conductors 1052 and 1050. An inserted wire through wire hole 1030 will compresses spring conductor 1070 downward which so as to hold the inserted wire in place, make electrical connection between the wire and pins 1040 and 1042, as well as served to hold the lever and button body 1002 in the depressed state so as to keep the connection between 1050 and 1052 open. In this way, impedance between 1050 and 1052 can be used to detect the physical presence of an inserted wire. Note that according to some embodiments, several rectangular connectors such as connector 1020 can be arranged into one or more rectangular banks of connectors for use on a backplate of the thermostat.

Figure 11:
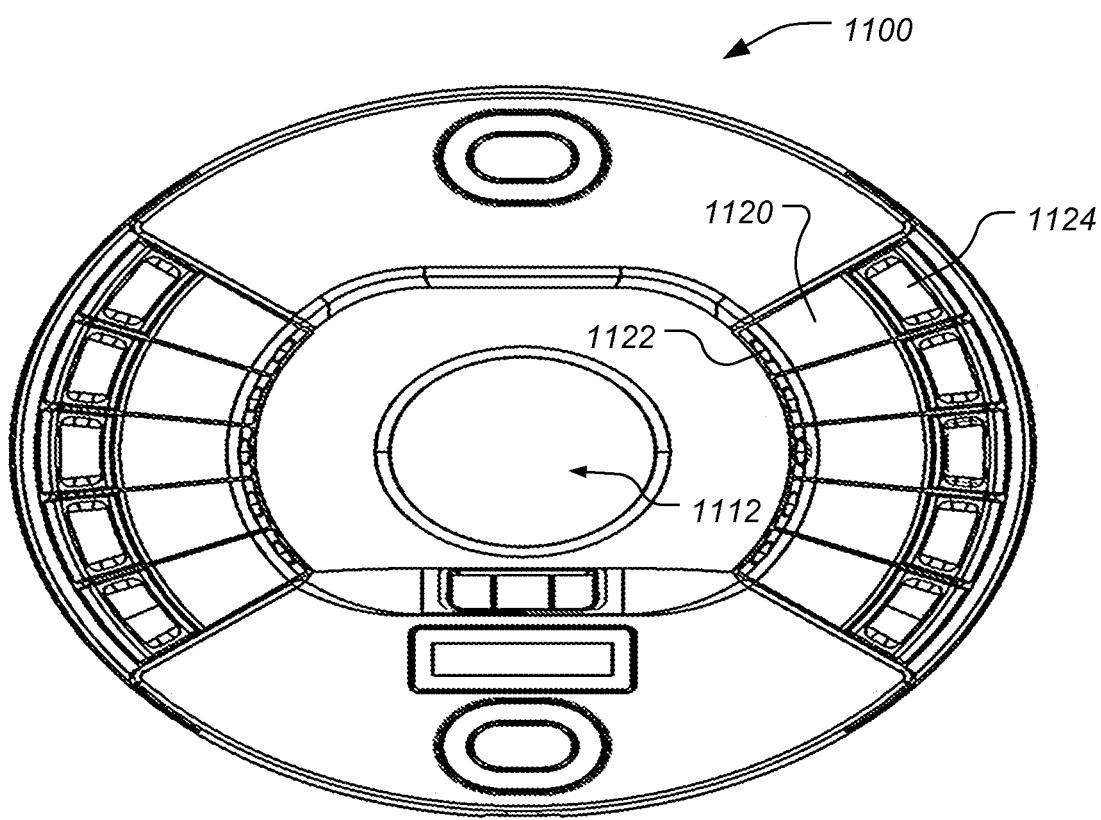
FIG. 11 is a diagram shown aspects of a thermostat backplate having an oval-shape, according to some embodiments.

FIG. 11 is a diagram shown aspects of a thermostat backplate having an oval-shape, according to some embodiments. Backplate 1100 is shown that has two arc-shaped banks each being made up of five wiring connectors. The connectors, for example wiring terminal 1120, allow for tool free wire connections through the use of a push button 1124 and insertion of the HVAC wire into a wire hole 1122, as described herein supra. The backplate includes oval-shaped central opening 1112, and the connection terminals are arranged such that the wiring holes face the central opening.

Although the tool-free wiring connectors have been thus far described with respect to a thermostat, according to some embodiments wiring connectors such as those described can be used in a number of other types of home electronic devices shown in FIG. 1, especially those devices that make connections to several wires in a relatively small location without the use of tools. Examples include: connection of irrigation valve control wires to an irrigation controller/timer; connection of sensor wires to multi-sensing hazard detection systems; connection of sensor wires to home alarm and/or entryway interface devices; connection of lighting control wires to lighting control systems; connection of speaker or other audio/video signal wires to audio/video electronic equipment; and connection of signal wires to intercom systems.

Various modifications may be made without departing from the spirit and scope of the invention. It is to be further appreciated that the term thermostat, as used hereinabove and hereinbelow, can include thermostats having direct control wires to an HVAC system, and can further include thermostats that do not connect directly with the HVAC system, but that sense an ambient temperature at one location in an enclosure and cooperatively communicate by wired or wireless data connections with a separate thermostat unit located elsewhere in the enclosure, wherein the separate thermostat unit does have direct control wires to the HVAC system. Accordingly, the invention is not limited to the above-described embodiments, but instead is defined by the appended claims in light of their full scope of equivalents.

What is claimed is:

1. A wall-mountable programmable electronic thermostat for controlling an HVAC system comprising:
   a backplate including a backplate circuit board, the backplate circuit board having a plurality of electrical components mounted thereon, the backplate adapted to be mounted on a wall, the backplate circuit board having a central opening to allow for the passage of a plurality of HVAC wires for electrical connection to the thermostat;
   a head unit body including a display for displaying information to a user, the head unit removeably mountable to the back plate;
   a plurality of wiring terminals each adapted and configured to make an electrical connection with an HVAC wire, wherein the plurality of wiring terminals are mounted on the backplate circuit board and arranged along one or more arcs about the central opening of the backplate circuit board, wherein each of the wiring terminals has a wire hole facing the central opening and a button member positioned nearer to an outer periphery of the backplate circuit board than said wire hole; and
   a backplate cover configured to cover said plurality of electrical components, the backplate cover having a plurality of openings through which said button members protrude to allow access thereto by the fingers of the user, whereby the user can access said button members without their fingers coming into contact with said electrical components.

2. A thermostat according to claim 1 wherein the backplate is circular-shaped and the plurality of wiring terminals are arranged along the one or more circular arcs about the central opening of the backplate circuit board.

3. A thermostat according to claim 1 wherein the plurality of wiring terminals includes at least eight wiring terminals.

4. A thermostat according to claim 3 wherein the at least eight wiring terminals are arranged along two circular arcs each including at least four wiring terminals.

5. A thermostat according to claim 4 wherein each of the wiring terminals is generally wedge-shaped having the wire hole facing the central opening and the button member being positioned near the outer periphery of the backplate circuit board.

6. A thermostat according to claim 5 wherein each of the generally wedge-shaped terminals occupies between 10 and 20 degrees of angular space as measured by an angle having a vertex at a center of the central opening of the backplate circuit board.

7. A thermostat according to claim 4 wherein each of the two circular arcs includes at least five wiring terminals, each of the wiring terminals are generally wedge-shaped having the wire hole facing the central opening and the button member being positioned near the outer periphery of the backplate circuit board, and each wiring terminal occupies between 14 and 16 degrees of angular space as measured by an angle having a vertex at a center of the central opening of the backplate circuit board.

8. A thermostat according to claim 1 wherein each of the wiring terminals includes the wire hole configured to accept insertion of an HVAC wire, and wherein a distance from a center of the central opening to each wire hole is at least 15mm.

9. A thermostat according to claim 8 wherein each wiring terminal is positioned on the backplate such that each wire hole is directly facing the center of the central opening.

10. A thermostat according to claim 8 wherein each wiring terminal is positioned on the backplate such that the distance from the center of the central opening to each wire hole is the equivalent.

11. A thermostat according to claim 1 wherein each wiring terminal is configured to allow a user to make an electrical connection with an HVAC wire without the use of tools by pressing the button member on the wiring terminal and inserting the HVAC wire into the wire hole.

12. A thermostat according to claim 1 wherein each of the wiring terminals is configured such that the physical presence of a wire inserted into the wiring terminal can be mechanically detected.

13. A thermostat according to claim 12 wherein the mechanical detection includes switching of a loop of an electrical circuit that does not include the inserted HVAC wire.

14. A wall-mountable programmable electronic thermostat for controlling an HVAC system comprising:
a backplate including a backplate circuit board, the backplate circuit board having a plurality of electrical components mounted thereon, the backplate adapted to be mounted on a wall, the backplate circuit board having a central opening to allow for the passage of a plurality of HVAC wires for electrical connection to the thermostat;
a head unit including a display for displaying information to a user, the head unit removeably mountable to the back plate;
a plurality of tool-free wiring terminals each adapted and configured to make an electrical connection with an HVAC wire, wherein the plurality of wiring terminals are mounted on the backplate circuit board and arranged along one or more arcs about the central opening of the backplate circuit board, each wiring terminal having a wire hole facing the central opening and a button member positioned nearer to an outer periphery of the backplate circuit board than said wire hole, the wiring terminals being adapted and configured to allow the user to make an electrical connection with the HVAC wire without the use of tools by pressing the button member and inserting the HVAC wire into the wire hole, wherein a distance between the button member and the wire hole is at least 8 millimeters; and
a backplate cover configured to cover said plurality of electrical components, the backplate cover having a plurality of openings through which said button members protrude to allow access thereto by the fingers of the user such that the user can access said button members without their fingers coming into contact with said electrical components.

15. A thermostat according to claim 14 wherein the distance between the button member and the wire hole is at least 10 millimeters.

16. A thermostat according to claim 14 wherein the button member when pressed actuates a lever that is at least 10 millimeters in length.

17. A thermostat according to claim 14 wherein the wire hole and the button member are on opposite sides of the wiring terminal, and the wiring terminal is generally wedge-shaped such that the side of the terminal including the wire hole is substantially shorter than a side of the terminal including the button member.

18. A thermostat according to claim 14 wherein each of the wiring terminals is configured such that the physical presence of a wire inserted into the wiring terminal can be mechanically detected.

19. A thermostat according to claim 18 wherein the mechanical detection includes switching of a loop of an electrical circuit that does not include the inserted HVAC wire.

20. A thermostat according to claim 14 wherein the button member includes an indentation to facilitate finger placement during pressing.

21. A wall-mountable programmable electronic thermostat for controlling an HVAC system comprising:
a backplate including a backplate circuit board, the backplate circuit board having a plurality of electrical components mounted thereon, the backplate adapted to be mounted on a wall, the backplate circuit board having a central opening to allow for the passage of a plurality of HVAC wires for electrical connection to the thermostat;
a head unit including a display for displaying information to a user, the head unit removeably mountable to the back plate;
a plurality of tool-free wiring terminals each adapted and configured to make an electrical connection with an HVAC wire, wherein the plurality of wiring terminals are mounted on the backplate circuit board and arranged along two circular arc-shaped banks about the central opening of the backplate circuit board, each wiring terminal having a wire hole facing the central opening and a button member positioned nearer to an outer periphery of the backplate circuit board than said wire hole, each bank including at least four wiring terminals, and each of the wiring terminals being adapted and configured to allow the user to make an electrical connection with the HVAC wire without the use of tools by pressing the button member and inserting the HVAC wire into the wire hole; and
a backplate cover configured to cover said plurality of electrical components, the backplate cover having a plurality of openings through which said button members protrude such that the user can access said button members without their fingers coming into contact with said electrical components.

22. A thermostat according to claim 21 wherein each of the wiring terminals is configured such that the physical presence of a wire inserted into the wiring terminal can be mechanically detected by switching of a loop of an electrical circuit that does not include the inserted HVAC wire.

\* \* \* \* \*